(12) United States Patent
Bayram et al.

(10) Patent No.: US 10,211,328 B2
(45) Date of Patent: Feb. 19, 2019

(54) NORMALLY-OFF CUBIC PHASE GAN (C-GAN) HEMT HAVING A GATE ELECTRODE DIELECTRICALLY INSULATED FROM A C-ALGAN CAPPING LAYER

(71) Applicant: The Board of Trustees of the University of Illinois, Urbana, IL (US)

(72) Inventors: Can Bayram, Champaign, IL (US); Ryan William Grady, Oak Forest, IL (US); Kihoon Park, Champaign, IL (US)

(73) Assignee: Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 15/703,850

(22) Filed: Sep. 13, 2017

(65) Prior Publication Data
US 2018/0083133 A1 Mar. 22, 2018

Related U.S. Application Data

(60) Provisional application No. 62/397,151, filed on Sep. 20, 2016.

(51) Int. Cl.
*H01L 29/778* (2006.01)
*H01L 29/04* (2006.01)
(Continued)

(52) U.S. Cl.
CPC .......... *H01L 29/7786* (2013.01); *H01L 29/04* (2013.01); *H01L 29/2003* (2013.01);
(Continued)

(58) Field of Classification Search
CPC ......... H01L 29/66431; H01L 29/66462; H01L 29/778–29/7789; H01L 29/2003;
(Continued)

(56) References Cited

U.S. PATENT DOCUMENTS 8,604,486 B2   12/2013   He
8,890,212 B2   11/2014   Jeon et al.
(Continued)

OTHER PUBLICATIONS

"Sentaurus Device User Guide Version K-2015.6," Synopsys, Mountain View, CA, USA, 1494 pages, 2015.
(Continued)

*Primary Examiner* — Marc Armand
*Assistant Examiner* — Younes Boulghassoul
(74) *Attorney, Agent, or Firm* — Lowenstein Sandler LLP

(57) ABSTRACT

A normally-off, heterojunction field effect transistor includes an intrinsic cubic-phase gallium nitride (c-GaN) substrate and an aluminum gallium nitride (AlGaN) capping layer disposed on the intrinsic c-GaN substrate. The AlGaN capping layer includes a first sublayer of intrinsic c-phase $Al_xGa_{1-x}N$ disposed on the c-GaN substrate, wherein the first sublayer is of a first thickness; a second sublayer of doped c-phase $Al_xGa_{1-x}N$ disposed on the first sublayer, and wherein the second sublayer is of a second thickness and is doped with a dopant. An insulating layer is disposed on the AlGaN capping layer, wherein the insulating layer is of a fourth thickness. A source electrode, a drain electrode, and a gate electrode are positioned adjacent to and on top of the insulating layer, respectively.

21 Claims, 18 Drawing Sheets

(51) Int. Cl.
*H01L 29/20* (2006.01)
*H01L 29/66* (2006.01)
*H01L 29/51* (2006.01)
*H01L 29/08* (2006.01)

(52) U.S. Cl.
CPC .......... *H01L 29/517* (2013.01); *H01L 29/518* (2013.01); *H01L 29/66462* (2013.01); *H01L 29/7787* (2013.01); *H01L 29/0847* (2013.01)

(58) Field of Classification Search
CPC .................. H01L 29/201; H01L 29/205; H01L 2924/13064; H01L 2924/13063; H01L 29/20–29/207; H01L 29/04; H01L 29/045
See application file for complete search history.

(56) References Cited

U.S. PATENT DOCUMENTS

| | | | | |
|---|---|---|---|---|
| 2002/0052076 | A1* | 5/2002 | Khan | H01L 29/7787 438/235 |
| 2004/0041169 | A1* | 3/2004 | Ren | H01L 29/66522 257/192 |
| 2011/0227093 | A1* | 9/2011 | Hikita | H01L 29/808 257/76 |
| 2012/0112202 | A1* | 5/2012 | Hwang | H01L 29/66462 257/76 |
| 2012/0280278 | A1 | 11/2012 | Curatola et al. | |
| 2014/0264380 | A1* | 9/2014 | Kub | H01L 29/41725 257/77 |
| 2015/0318276 | A1* | 11/2015 | Bayram | H01L 21/8258 257/195 |
| 2017/0263741 | A1* | 9/2017 | Isobe | H01L 29/7786 |
| 2017/0365700 | A1* | 12/2017 | Beam, III | H01L 29/36 |

OTHER PUBLICATIONS

Bougrov, V., et al., "Properties of Advanced Semiconductor Materials GaN, AlN, InN, BN, SiC, SiGe," John Wiley & Sons, New York, Chapter 1, pp. 1-27, 2001.

Shen, K.J., et al., "Recent Development in Flourine-Ion-Implanted GaN-Based Heterojunction Power Devices," Wide Bandgap Power Devices and Applications (WiPDA), 2013 IEEE Workshop, pp. 92-95, (2013).

Chow, T.P., "Wide and Extreme Bandgap Semiconductor Devices for Power Electronics Applications," Lester Eastman conference on High Performance Device (LEC) 54-P1, IEEE, 4 pages, 2014.

Collins, A.T., et al., "Lattice Vibration Spectra of Aluminum Nitride," Physical Review, vol. 158, No. 3, pp. 833-838, Jun. 15, 1967.

Demitrijev, S. et al., "Power-Switching Appplications Beyond Silicon: Status and Future Prospects of Sic and GaN Devices," MRS Bulletin, 40, (05), pp. 399-405, (2015).

Goldberg Yu, Y., "Properties of Advanced Semiconductors Materials GaN, AlN, InN, BN, SiC, SiGe," John Wiley & Sons, Inc., New York, Chapter 2, pp. 31-47, 2001.

Granzner, R., et al., "Vertical Design of Cubic GaN-based High Electron Mobility Transistors," Journal of Applied Physics 110.11, 9 pages, (2011): 114501.

Hilt, Oliver, et al., "High-Voltage Normally OFF GaN Power Transistors on SiC and Si Substrates," MRS Bulletin, Materials Research Society, vol. 40, pp. 418-424, May 2015.

Lenka, T.R, et al., "Effect of Structural Parameters on 2DEG Density and C-V Characteristics of AlxGa1-XN/AlN/GaN-Based HEMT," Indian Journal of Pure & Applied Physics, vol. 49, pp. 416-422, Jun. 2011.

Matthews, J.W., et al., "Defects in Epitaxial Multilayers," Journal of Crystal Growth, 27, pp. 118-125, 1974.

Michaelson, H.B., "The Work Function of the Elements and its Periodicity," Journal of Applied Physics, vol. 48, No. 11, pp. 4729-4733, Nov. 1977.

Mizutani, Takashi, et al., "Normally off AlGaN/GaN High Electron Mobility Transistors with p-InGaN Cap Layer," Journal of Applied Physics 113.3, 6 pages, (2013): 034502.

Morkoc, H., "Nitride Semiconductors and Devices," Springer, Berlin, pp. 70-79, 1999.

Saito, W., et al., "Recessed-Gate Structure Approach Toward Normally Off High-Voltage AlGaN/GaN HEMT for Power Electronics Applications," IEEE Transactions on Electron Devices, vol. 53, No. 2, pp. 356-362, Feb. 2006.

Saito, W., et al. "Theoretical Limit Estimation of Lateral Wide Band-Gap Semiconductor Power-Switching Device," Solid-State Electronics 48 pp. 1555-1562 (2004).

Schroeder, D., "Modelling of Interface Carrier Transport for Device Simulation," Springer, pp. 160-168, 1994.

Suh, C., et al., "p-GaN/AlGaN/GaN Enhancement-Mode HEMTs," 2006 64th Device Research Conference, IEEE, pp. 163-164, 2006.

Varshni, Y.P., "Temperature Dependence of the Energy Gap in Semiconductors," Physica, 34, pp. 149-154, 1967.

Vurgaftman, I., et al., "Band Parameters for III-V Compound Semiconductors and Their Alloys," Journal of Applied Physics, vol. 89, No. 11, 62 pages, Jun. 1, 2001.

\* cited by examiner

NORMALLY-OFF CUBIC PHASE GAN (C-GAN) HEMT HAVING A GATE ELECTRODE DIELECTRICALLY INSULATED FROM A C-ALGAN CAPPING LAYER

REFERENCE TO EARLIER FILED APPLICATION

This application claims the benefit under 35 U.S.C. § 119(e) of U.S. Provisional Patent Application No. 62/397,151, filed Sep. 20, 2016, which is incorporated herein, in its entirety, by this reference.

FEDERALLY SPONSORED RESEARCH OR DEVELOPMENT

This disclosure was made with government support under NSF-ECCS-16-52871 awarded by the National Science Foundation Faculty Early Career Development Program. The government has certain rights in the invention.

BACKGROUND

Power electronics are devices that are used in the distribution and collection of energy. These devices must be able to withstand large reverse biases, as well as significant forward currents for high power applications. Common applications for power semiconductor devices are AC-DC and DC-DC converters found in numerous consumer applications, including televisions, computers, and battery chargers. On the industrial scale, motor controls require devices suitable for their circuitry. Additionally, the push for highly efficient devices with minimal losses to heat and switching times is now important from both an economic as well as an ecological point of view.

One challenge in the design of power electronics, particularly for RF applications, is that many devices and materials are typically better suited only for high power or high speed applications, but not both. Current silicon-based technologies are reaching the performance levels indicated by several theoretical figures of merit in high-power and high-speed applications, requiring new material systems to be investigated. Gallium nitride (GaN) is an ideal candidate to meet both of these needs due to its wide bandgap, high critical breakdown field, and high mobility. Use of GaN in power electronics, however, brings additional challenges in the design of normally-off devices. Due to the inherent polarization field in hexagonal phase GaN, a conductive two-dimensional electron gas (2DEG) is formed under zero bias conditions. Normally-off devices, however, are sought for high-power applications for reasons of safety, e.g., circuit protection, and power savings, for example.

Several methods currently exist to create a normally-off GaN device, including fluorine implantation below the gate, recessed gate approaches, and p-GaN gates. However, normally-off devices enabled by these approaches are yet to mature. Recently, inverted GaN or AlGaInN hetero-structures and N-polar structures were explored for p-channel field-effect transistors (FETs) without success.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

DETAILED DESCRIPTION

Figure 1A:
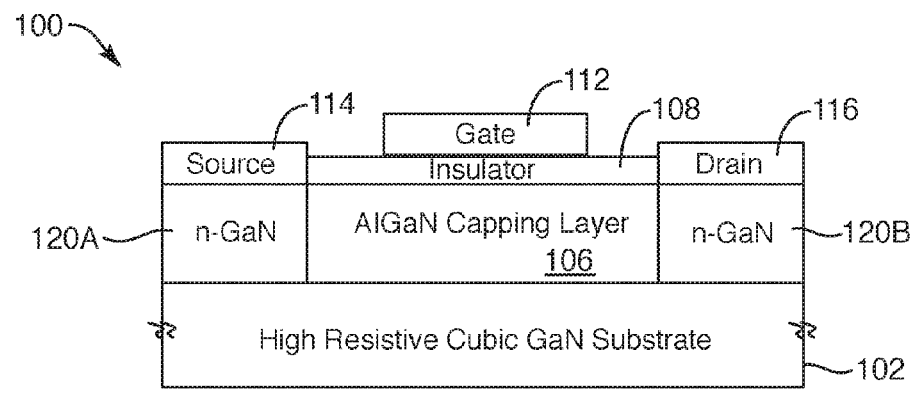
FIG. 1A is a diagram illustrating layers of an n-channel, cubic gallium nitride (c-GaN) field-effect transistor (FET), according to embodiments.

By way of introduction, the present disclosure relates to gallium nitride (GaN) field-effect transistors (FETs) with two-dimensional-hole-gas (2DHG) p-channel and two-dimensional-electron-gas (2DEG) n-channel behavior, which may be designed to be normally on or off. The present disclosure also provides designs of complementary logic circuits enabled by the disclosed p-channel and n-channel GaN FETs.

Silicon-based transistors are reaching maturity as more and more applications (such as DC-DC power conversion, 5G networks, and the like) demand high-power and high-speed operation, which create a demand for new material and device structure investigations. GaN FETs may address emerging needs, particularly in high-power (greater than 10 W), high-frequency (greater than 10 GHz), and high-ambient temperature (greater than 200° C.) applications. The bottleneck in GaN FETs is the p-channel operation, which are used for complementary logic circuits driving such power or radio frequency (RF) GaN FETs.

Due to the inherent polarization fields in hexagonal phase (h-phase) GaN, GaN FETs of h-phase GaN are normally n-channel, meaning a conductive two-dimensional electron gas (2DEG) channel is formed in the AlGaN/GaN hetero-interface, even in the absence of an external bias. The polarization means that there are built-in electric fields, meaning an h-GaN is usually in a channel on state. For complementary logic applications, however, 2DHG p-channel FETs are also employed. Several methods of implementing p-channel GaN FETs have been explored including inverted GaN/AlGaInN hetero-structures and N-polar structures. However, p-channel devices enabled by these approaches rely on polarization doping, making such devices inherently limited because both n-channel and p-channel devices cannot be fabricated on the same epitaxial layer. For example, where p-channel devices are formed on an N-polar layer, n-channel devices are formed on a Ga-polar layer.

Disclosed is an alternative method for creation of a p-channel GaN FET design, e.g., via employment of the naturally polarization-free cubic-phase (c-phase) GaN and δ-doping technology. The disclosed GaN FETs also enable creation of n-channel devices, which facilitates application of complementary logic GaN FET on the identical platform. Disclosed are the design, simulations, and optimizations of these devices to show proof of concept of the fundamental electronic transport properties of p-channel and n-channel c-phase GaN FETs. Additionally, the proposed research is scalable on a CMOS-compatible silicon (Si) substrate so as to facilitate industrial adoption and generate new knowledge on GaN—Si hetero-integration. Overall, results from simulations show success with p-channel and n-channel c-phase GaN FET designs and complementary-metal-oxide GaN transistor logic circuitry.

Power conversion is everywhere. Particularly, power regulation of AC lines into DC as well as emerging inverter needs for renewable energy sources (photovoltaic and wind) are putting emphasis into this research area. Present applications employ silicon-based transistors, which can only handle a limited amount of voltage (~50V) due to their low bandgap (1.1 eV). This limited voltage handling leads to multi-stage converters, typically three stages. However, if the same system (such as from input line of 110 V to PC line of 1 V) is redesigned by using gallium nitride transistors (e.g., that have a bandgap of 3.4 eV and breakdown voltages of about 1 kV), it would require two-stage converters and increase the overall efficiency of the conversion process.

The disclosed design is to push the limits of GaN transistors for logic applications and eliminate the need for an Si control element in Si-based designs and the need for cascoded GaN high-power/RF efficient energy converters. What this means is that an electrical system architecture distributing DC power at kilovolt levels could save significant energy. Moreover, electric cars and unmanned vehicles may be charged faster with GaN devices than Si devices thanks to handling of more current in GaN devices, so data/computer centers could halve their energy need by using GaN devices in place of Si devices thanks to better voltage regulation.

In this respect, the present disclosure offers emerging power electronics market reliable logic control capabilities with 500 MHz+ switching speeds and withstanding 300 V+. The disclosed p-channel and n-channel GaN FETs constitutes the basis of an innovative reduced total life cycle cost that will serve as the corner stone of the next generation integrated, scalable, and reliable power systems.

Silicon CMOS circuits continue to drive to impressive levels of RF performance. At the same time, these impressive levels of performance come with massive integration density, allowing large digital correction or signal-conditioning circuits to be integrated on the same die. The one significant challenge for silicon devices, however, is in supporting high-voltage, high-power-density applications in power amplification and power conversion. For power conversion applications, discrete Si-trench devices can achieve breakdown voltages when in excess of 50 V and with switching frequencies below 1 MHz. Low-switching frequencies lead to large passive sizes, degraded transient response, and inability to support RF and millimeter-wave applications.

For nitride-based compound semiconductors, the large bandgap (3.4 eV for GaN and 6.2 eV for AlN), high critical electric field strength (on the order of $10^6$ V/cm) and high saturated electron drift velocities (on the order of $10^7$ cm/s) make these materials ideal for high-power, high-voltage applications. The formation of a two-dimensional electron gas (2DEG) in the AlGaN/GaN system due to conduction band offsets and polarization-induced doping results in sheet concentrations of the order of $10^{13}/cm^2$ and relatively high mobility values of the order of 1500 $cm^2$/V-s, leading to transistor cut-off frequencies in excess of 300 GHz.

For next-generation, high-power and high-voltage applications, GaN transistors are ideal for replacing Si CMOS applications. Integration of GaN transistors with power systems leads to new levels of performance in both power amplification and power conversion. GaN devices employed in the power amplifier and in the power train of the buck converter, for example, allow high-power densities, high performance, and reduced volume unachievable with any silicon-based technology. For example, in vehicle electrification, such high current transistors may increase the charging speed considerably increasing vehicle mobility.

The disclosed transistors target applications for high-voltage or high-current applications (PV inverter, wind, automotive, aerospace, traction, industrial motor drive, military). Power electronics is gaining momentum thanks to increased voltage and current levels in renewable energy space. With such ongoing efforts, big opportunity rises to apply this know-how in other areas requiring use of power devices.

One challenge in deployment of GaN devices in such demanding applications is logic circuitry. GaN devices can sustain high temperatures and hence reduce cooling needs. Still, lack of suitable logic circuitry necessitates cascode formations where the logic circuitry of Si is used for managing GaN high-power and RF devices. As such, entire systems are limited by the Si devices and the full potential of GaN devices bottlenecks. Hence, GaN-based complementary logic circuits capable of operating under the very same demanding conditions as GaN-based high-power and RF circuits may provide the solution.

Today, the highest voltage GaN-based transistors are operating around about 3000 V. A further increase in voltage leads to premature breakdown mechanisms such as leakage through the buffer layers (layers between the active 2D electron gas layers and the substrate) due to material defectives and unoptimized/unintentional doping effects. Another issue is the shift in the threshold voltage of these devices. As power devices are normally-off for safe operation, the change in the threshold voltage (mainly due to charge trapping) may be undesirable.

As discussed, an existing issue in GaN power transistors is providing p-channel operation. Due to the inherent polarization fields in h-phase GaN, current GaN FET of h-phase are normally-on, meaning a conductive two-dimensional electron gas (2DEG) channel is formed in the AlGaN/GaN hetero-interface even under the absence of an external bias. For safety and energy savings in high-power and high-frequency applications, normally-off FETs are ideal. Particularly for logic applications, a p-channel device is also normally employed.

Several methods of implementing normally-off GaN FETs have been explored including fluorine implantation below the gate, a recessed gate approach, and p-GaN gate insertion. However, normally-off devices enabled by these approaches are yet to mature. In the case of fluorine implantation, the on-state $I_{DS}$ can be reduced, while the recessed gate approach can only shift the turn-on voltage minimally and lead to unsafe operating conditions. Recently, inverted GaN or AlGaInN hetero-structures and N-polar structures have been explored for p-channel FETs without success. Lack of normally-off GaN devices combined with the need for logic operations in power/RF systems require the employment of Si in microchips. But, as mentioned, the benefits of GaN devices such as high-temperature operation and reduced cooling are limited by Si logic circuitry.

Accordingly, disclosed is a method for a p-channel GaN FET design, which utilizes polarization-free cubic phase (c-phase) GaN. Herein we explain the use of such a design in both p-channel and n-channel GaN logic circuitries. More specifically, the present disclosure explores a p-channel and n-channel c-phase GaN FET platform that bridges material, device, and architecture innovations and integrates both n-channel and p-channel devices on identical substrates.

TABLE 1

| Parameter | Symbol | Cubic | | Hexagonal | |
| --- | --- | --- | --- | --- | --- |
| | | c-AlN | c-GaN | h-AlN | h-GaN |
| Bandgap at 0K | $E_G$ (eV) | 6.00 | 3.299 | 6.25 | 3.510 |
| Varshni coefficients | $\alpha$ (eV/K) | $5.93 \times 10^{-4}$ | $5.93 \times 10^{-4}$ | $1.799 \times 10^{-3}$ | $9.09 \times 10^{-4}$ |
| | $\beta$ (K) | $6.00 \times 10^2$ | $6.00 \times 10^2$ | $1.462 \times 10^3$ | $8.30 \times 10^2$ |

TABLE 1-continued

| | | Cubic | | Hexagonal | |
| Parameter | Symbol | c-AlN | c-GaN | h-AlN | h-GaN |
|---|---|---|---|---|---|
| Electron affinity | $\chi$ (V) | 1.999 | 3.922 | 1.01 | 3.18 |
| Relative permittivity | $\varepsilon$ | 9.14 | 9.7 | 8.5 | 8.9 |
| Electron mobility | $\mu_e$ (cm$^2$/V – s) | 300 | 1000 (1000) | 300 | 1000 (1500) |
| Hole mobility | $\mu_h$ (cm$^2$/V – s) | 20 | 150 (250) | 14 | 200 |
| Mg activation energy | $E_{Mg}$ (meV) | 330-360 | 130-140 | 514-795 | 204-253 |

Table 1 lists a number of materials parameters, each corresponding symbol, c-phase values for c-AlN and c-GaN for each, and for comparison, an h-phase value for h-AlN and h-GaN. Mobilities in the parentheses are values for carriers in the 2D electron/hole gas. The cubic material parameters are used in the p-channel device simulation, which is discussed later. The cubic phase has intrinsically more isotropic properties including smaller effective masses, higher drift velocity, higher carrier mobility, higher doping efficiency than its hexagonal counterpart.

Accordingly, gallium nitride (GaN) promises fantastic devices in the form of GaN FETs. Typical devices utilize the piezoelectric effect in hexagonal GaN aligned with the c-axis. However, these devices are normally-on devices and are unsuitable for power applications. Through use of GaN that has instead been grown in the cubic phase, designers can create a normally-off device, which still takes advantage of the material properties. In order to design such devices, technology computer aided design (TCAD) software may be used to simulate devices of a particular design.

FIG. 1A is a diagram illustrating layers of an n-channel, cubic gallium nitride (c-GaN) field effect transistor (FET) 100, according to various embodiments. The c-GaN FET 100 may include a high resistance, c-GaN substrate 102 with a c-AlGaN capping layer 106, a first n-doped GaN contact region 120A, and a second n-doped GaN contact region 120B disposed on the c-GaN substrate 102. An insulating layer 108 may be disposed on the AlGaN capping layer 106 to prevent current leakage. A source electrode 114 is disposed on the first n-doped GaN (n-GaN) contact region 120A, a drain electrode is disposed on the second n-GaN contact region 120B, and a gate electrode 112 is disposed on the insulating layer 108 or directly on to the AlGaN capping layer 106 should the insulating layer 108 not be included.

In various embodiments, a gate metal of the gate electrode 112 may be chosen to create a Schottky contact to the AlGaN layer. The source and drain metals of, respectively, the source electrode 114 and the drain electrode 116 may be chosen to create ohmic contacts to the n-GaN regions.

Figure 1B:
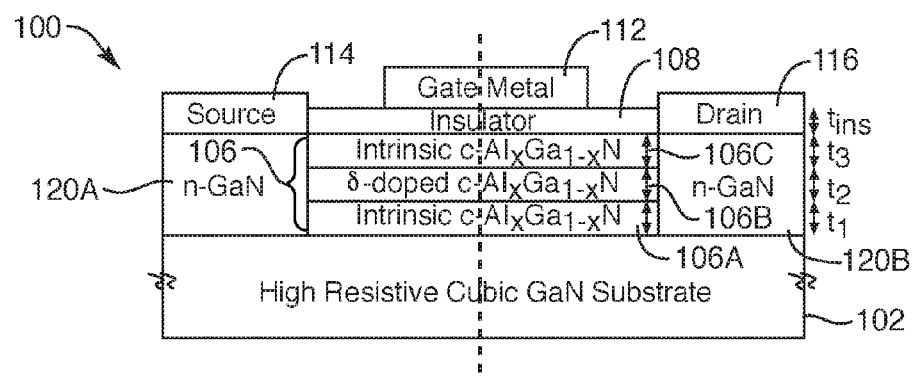
FIG. 1B is a more-detailed diagram of the cubic-GaN FET of FIG. 1A, further illustrating sub-layers of the aluminum gallium nitride (AlGaN) capping layer, with first thickness ($t_1$), second thickness ($t_2$), and third thickness ($t_3$), and a fourth thickness ($t_{ins}$) of an optional insulating layer, according to various embodiments.

FIG. 1B is a more-detailed diagram of the cubic-GaN FET 100 of FIG. 1A, further illustrating sub-layers of the aluminum gallium nitride (AlGaN) capping layer 106. For example, the AlGaN capping layer 106 may include a first sublayer 106A of intrinsic cubic-phase $(Al_xGa_{1-x}N)_1$ disposed on the intrinsic cubic-phase GaN substrate 102, a second sublayer 106B of doped cubic-phase $(Al_xGa_{1-x}N)_2$ disposed on the first sublayer 106A, and a third sublayer 106C of undoped, intrinsic cubic-phase $(Al_xGa_{1-x}N)_3$ disposed on the second sublayer 106B. The term "intrinsic" in this context means "undoped." The first sublayer 106A may have a first thickness ($t_1$), the second sublayer 106B a second thickness ($t_2$), and the third sublayer 106C may have a third thickness ($t_3$). If the device is created without the optional insulating layer 108, and the combination of thicknesses $t_1$, $t_2$, and $t_3$ are below a critical thickness ($h_c$), e.g., 20 nm, the cubic-GaN FET 100 may generally be retained in the normally-off state, and enjoy additional benefit predicted by the Matthews-Blakeslee equation.

As illustrated in FIG. 1B, the insulating layer 108 may be of a fourth thickness ($t_{ins}$), but is optional, particularly if the third sublayer 106C is present. The dopant for the second sublayer 106B may be a δ-doped (or delta-doped) material, which indicates the doping includes very thin (e.g., several monolayers) of high concentrations of dopant within the second sublayer 106B.

The cubic-phase $Al_xGa_{1-x}N$ sublayers of the GaN FET 100 may be grown on top of a cubic-GaN substrate 102. The δ-doped $(AlGaN)_2$ layer may provide carriers to the two-dimensional-electron-gas (2DEG) channel formed at the AlGaN/GaN hetero-interface while the $(AlGaN)_1$ layer separates the δ-doped $(AlGaN)_2$ layer from the channel and reduces the impurity scattering effects of the dopant. The $(AlGaN)_3$ layer may distance the gate contact from the 2DEG, controlling the gate-contact-induced electric field effects on the 2DEG channel. For a p-channel device (FIG. 9), which will be discussed in more detail, the c-GaN contact regions 120A and 120B will be p-doped GaN, choices of metal for the source and drain electrodes will vary, and the δ-dopant will be Mg, although other choices may also be appropriate for the p-channel device.

Figure 1C:
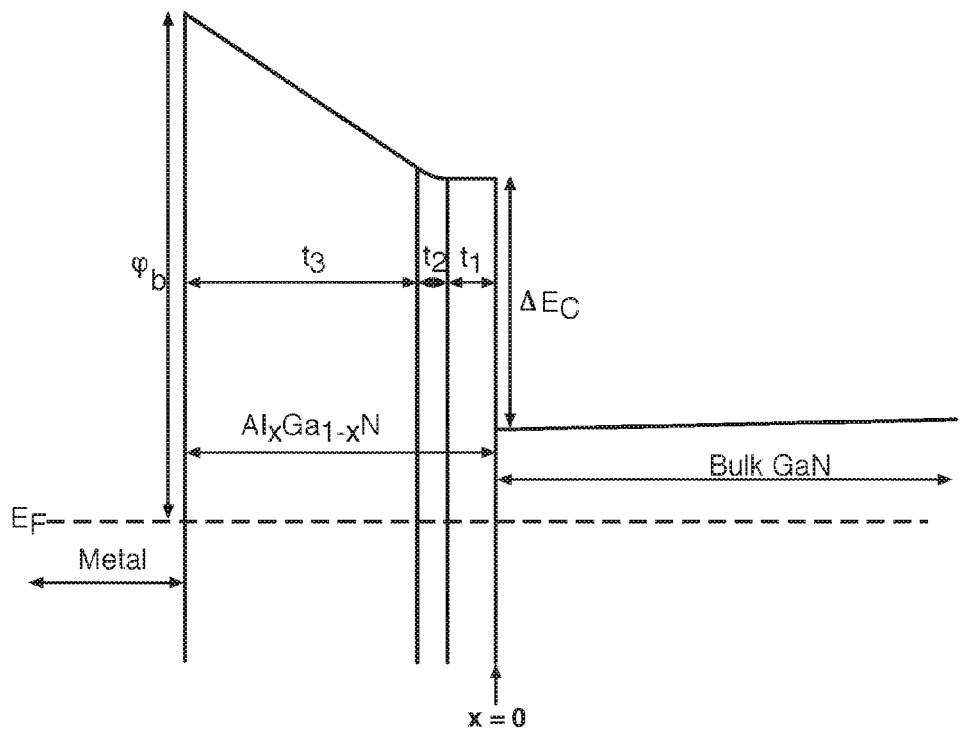
FIG. 1C is a graph illustrating an equilibrium band structure of the c-GaN FET illustrated in FIG. 1B without the optional insulating layer according to various embodiments.

FIG. 1C is a graph illustrating an equilibrium conduction band structure of the cubic-GaN FET 100 illustrated in FIG. 1B, without the insulator layer 108, according to various embodiments. The metal-semiconductor work function difference is given by $\varphi_b$. The thicknesses $t_1$, $t_2$, and $t_3$ of the three sublayers 106A, 106B, and 106C of the AlGaN capping layer 106 are seen in their respective locations. The position x=0 marks the $Al_xGa_{1-x}N$/GaN junction. The $\Delta E_C$ variable represents the conduction band offset.

For the present disclosure, there are five parameters of particular interest: the aluminum content ($x_{Al}$), the thicknesses $t_1$, $t_2$, and $t_3$, and the metal work function of the gate contact. Finally, n-doped GaN is used for current flow from the contacts to the 2DEG, and later will be switched to p-doped GaN for the p-channel devices.

The n-channel, c-GaN FET 100 exhibits normally-off behavior in simulation as the design parameters, $x_{Al}$, $t_1$, $t_2$, $t_3$, and $\Phi_M$ are varied across a wide range. In particular, for combinations of $t_1+t_2+t_3$ that are below $h_c$, the turn on voltage is maximized. This range of parameters offers the device designer the ability to pick a particular threshold voltage ($V_T$) and channel electron concentration ($n_s$) by choosing the parameter values correctly.

Figure 1D:
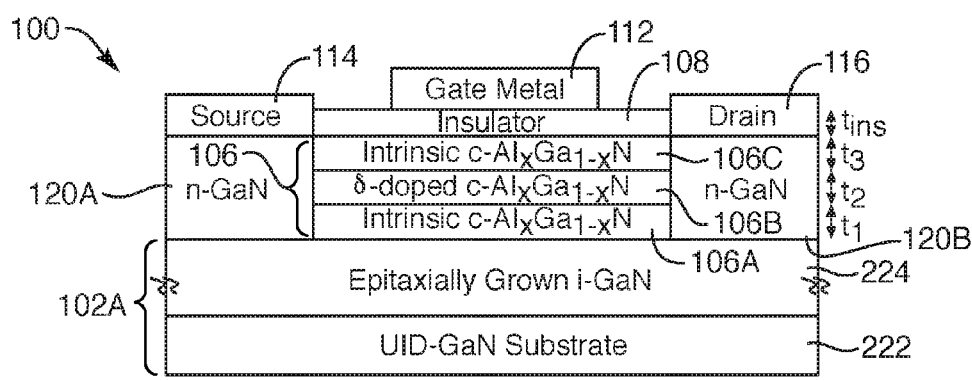
FIG. 1D is a diagram illustrating an alternative substrate for use in building the c-GaN FET illustrated in FIG. 1A, according to various embodiments.

FIG. 1D is a diagram illustrating an alternative substrate 102A for use in building the cubic-GaN FET 100 illustrated in FIG. 1A, according to various embodiments. For example, the alternative substrate 102A for the c-GaN FET 100 may be an unintentionally doped (UID) cubic layer GaN 222 with high purity epitaxially-grown GaN (epi-GaN) layer 224 on top of the UID c-GaN layer 222. The epi-GaN layer 224 may be designed thick enough to confine currents. The δ-doping in the (AlGaN)$_2$ sublayer 106B may be electron donors or acceptors to create n-channel and p-channel devices, respectively.

The c-GaN FET 100 was simulated using commercially available Synopsys Sentaurus TCAD software. For this investigation, the dimensions were taken to be a 1 μm-thick c-GaN substrate, a 1 μm-long gate, a 0.25 μm-long source and drain regions, with a 0.25 μm spacing between contacts. The aluminum content, thickness of layers $t_1$, $t_2$, and $t_3$, and the gate metal work function were left variable. Table 2 has the values of several relevant physical parameters used during these computations.

TABLE 2

| Parameter | Symbol | Value |
| --- | --- | --- |
| Bandgap at 0K | $E_{G0,GaN}$ | 3.299 eV |
|  | $E_{G,AlN}$ at 0K | 6.00 |
| Varshni coefficients | $\alpha_{GaN}$ | 5.93e-04 eV/K |
|  | $\beta_{GaN}$ | 6.00e+02K |
|  | $\alpha_{AlN}$ | 5.93e-4 eV/K |
|  | $\beta_{AlN}$ | 6.00e+02K |
| Relative permitivity | $\varepsilon_{r,GaN}$ | 9.7 |
|  | $\varepsilon_{r,AlN}$ | 9.14 |
| Electron affinity | $\chi_{AlN}$ | 1.999 V |
|  | $\chi_{GaN}$ | 3.922 V |
| Elastic coefficients | $c_{11}$ | $25.3 \times 10^{11}$ dyn/cm$^{-2}$ |
|  | $c_{12}$ | $16.5 \times 10^{11}$ dyn/cm$^{-2}$ |

For modeling the band structure of the wide bandgap materials, the temperature dependence given by the Varshni model $$E_G(T) = E_G(0) - \frac{\alpha T^2}{\beta + T}$$

was used, with values of α, β as given in Table 2.

During the course of simulation, Fermi statistics were used to improve accuracy as $E_F$ (Fermi energy) approached and exceeds $E_C$ (conduction energy). Thermionic emission currents were considered for electrons in order to accurately model carrier flow along a heterojunction. A heterojunction is the interface that occurs between two layers or regions of dissimilar crystalline semiconductors, which have unequal band gaps. For carrier flow and densities, when confined along a triangular well, a quantum potential is considered. This potential, denoted $\Lambda_n$, is used to add quantization to carrier densities in the quantum well according to $$n = N_C F_{\frac{1}{2}}\left(\frac{E_{F,n} - E_C - \Lambda_n}{kT_n}\right)$$

without impacting simulation times significantly. In one embodiment, $\Lambda_n$ is obtained by solving $$\Lambda_n = -\frac{\gamma \hbar^2}{12 m_n}\left\{\nabla^2 \ln n + \frac{1}{2}(\nabla \ln n)^2\right\} = -\frac{\gamma \hbar^2}{6 m_n}\frac{\nabla^2 \sqrt{n}}{\sqrt{n}},$$

where γ is a fit factor. The effects of bandgap narrowing with heavy doping are neglected based on the difficulty in activating dopants in GaN. Carrier recombination was computed using a combination of Shockley-Hall-Read recombination, Auger recombination, and radiative recombination models.

While modeling the electrical behavior of the structure, the basic transport equations were solved while the potential at various electrodes was swept. Transient behavior was ignored, and only quasi-stationary solutions were used. The equations solved at each step of the simulation were Poisson's equation, the continuity equation for both electrons and holes, and the quantum potential equations.

The structure was simulated under these conditions while varying the aluminum mole fraction, gate metal work function, and thickness of $t_1$, $t_2$, and $t_3$. The $x_{Al}$ content ranged from 10% to 40%, the work function ranged from 4.33 to 5.27 eV, thickness $t_1$ between 1 nm and 9 nm, thickness $t_2$ from 1 nm to 5 nm, and thickness $t_3$ from 5 to 25 nm. A default set of parameters in Table 3 were used as experimental controls. For the study of each individual variable, the band structure near the heterojunction was analyzed. The criteria for normally-off behavior were assumed to be the formation of a 2DEG as the Fermi level exceeds the conduction band minimum at the interface.

Special attention was paid to normally-off versus normally-on transitions in the simulations. The following graphs will present simulation results based on variation of these design parameters $x_{Al}$, $t_1$, $t_2$, $t_3$, and $\Phi_M$. To start with, the following values in Table 3 were used to test the effect of thickness $t_1$. The values of these parameters (and others) to which this disclosure refers may be varied within certain ranges of each value as will be discussed.

TABLE 3

| Parameter | Value |
| --- | --- |
| $\Phi_M$ | 5.65 V (Pt contact) |
| $t_{ins}$ | 5 nm |
| $t_2$ | 2 nm |
| $t_3$ | 18 - $t_1$ nm |
| $\chi_{Al}$ | 25% |
| $N_{D,i2}$ doping in δ-doped layer | $1 \times 10^{19}$ cm$^{-3}$ |
| $N_{D,SD}$ doping in source, drain | $1 \times 10^{20}$ cm$^{-3}$ |

Figure 2A:
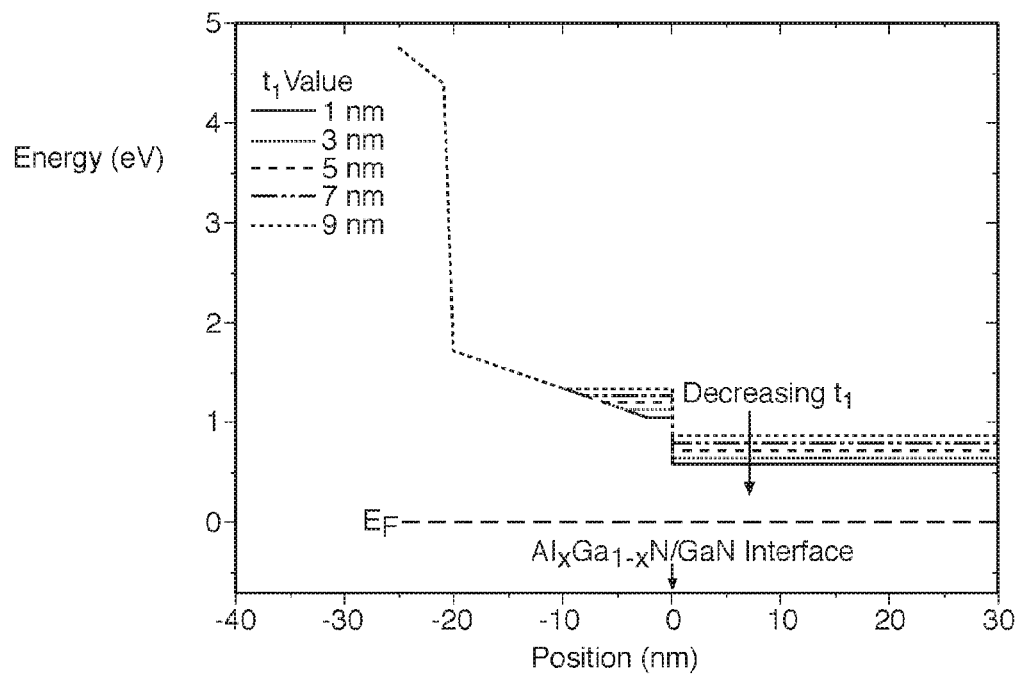
FIG. 2A is a graph illustrating simulation results of conduction band energy of the n-channel, c-GaN FET as a function of decreasing first thickness ($t_1$) of the first AlGaN sublayer, according to one embodiment.
Figure 2B:
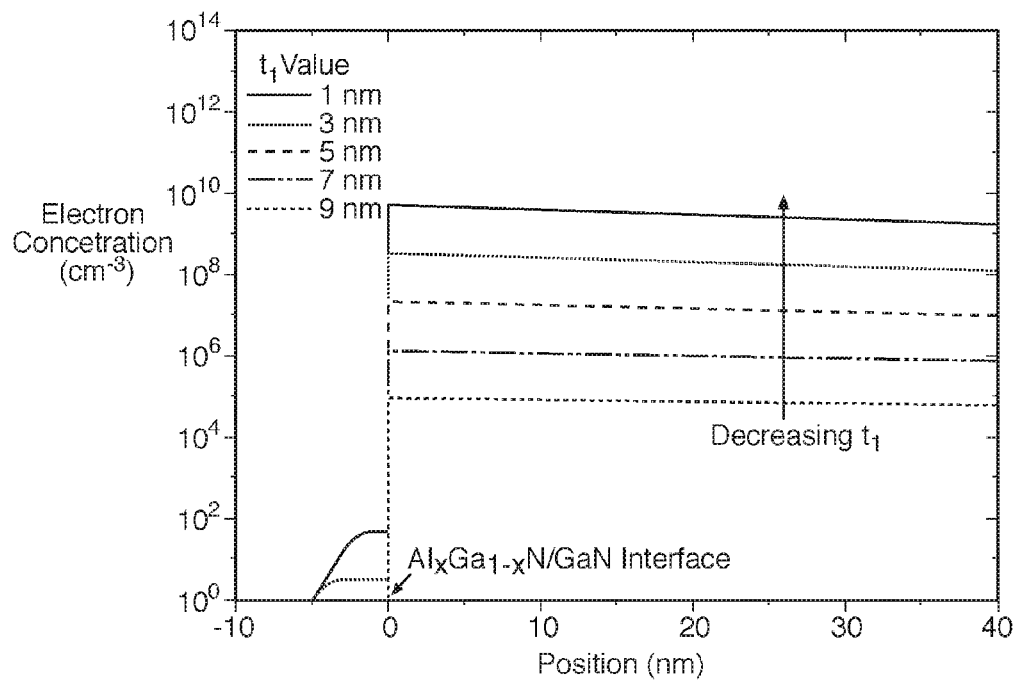
FIG. 2B is a graph illustrating simulation results of electron concentration of the n-channel, c-GaN FET as a function of decreasing first thickness ($t_1$) of the first AlGaN sublayer, according to one embodiment.

With additional reference to Table 3, FIG. 2A is a graph illustrating simulation results of conduction band energy of the n-channel, c-GaN FET as a function of decreasing first thickness ($t_1$) of the first AlGaN sublayer, according to one embodiment. FIG. 2B is a graph illustrating simulation results of electron concentration of the n-channel, c-GaN FET as a function of decreasing first thickness ($t_1$) of the first AlGaN sublayer. The value of $t_1$ may have minimal impact on the normally-on versus normally-off characteristics of the c-GaN FET 100. As $t_1$ increases from 1 to 9 nm, the device remains normally off as indicated by both the band diagram and the electron concentration. The purpose of (AlGaN)$_1$ (and corresponding thickness $t_1$) is to spatially separate doping and the 2DEG channel to limit doping-dependent mobility degradation. The results indicate a small $t_1$ may ensure carrier diffusion from (AlGaN)$_2$ to the 2DEG.

TABLE 4

| Parameter | Value |
| --- | --- |
| $\Phi_M$ | 5.65 V (Pt contact) |
| $t_{ins}$ | 5 nm |
| $t_1$ | 3 nm |
| $t_3$ | (17 - $t_2$) nm |
| $\chi_{Al}$ | 25% |

TABLE 4-continued

| Parameter | Value |
| --- | --- |
| $N_{D,t2}$ doping in δ-doped layer | $1 \times 10^{19}$ cm$^{-3}$ |
| $N_{D,SD}$ doping in source, drain | $1 \times 10^{20}$ cm$^{-3}$ |

Figure 3A:
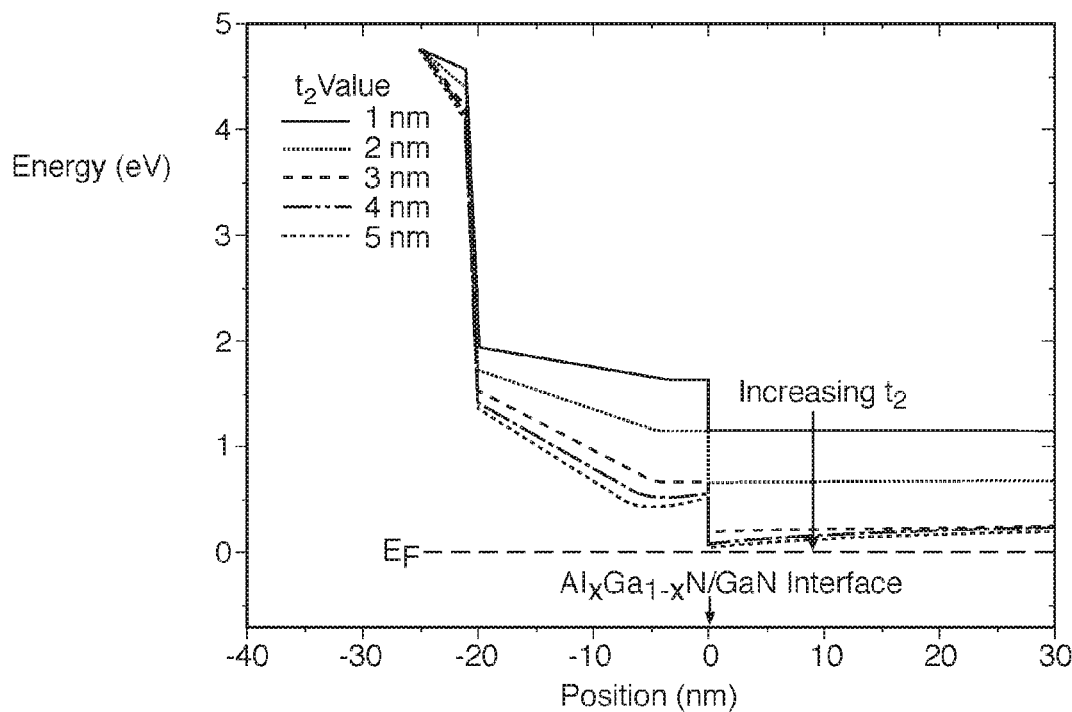
FIG. 3A is a graph illustrating simulation results of conduction band energy of the n-channel, c-GaN FET as a function of increasing second thickness ($t_2$) of the second AlGaN sublayer, according to one embodiment.
Figure 3B:
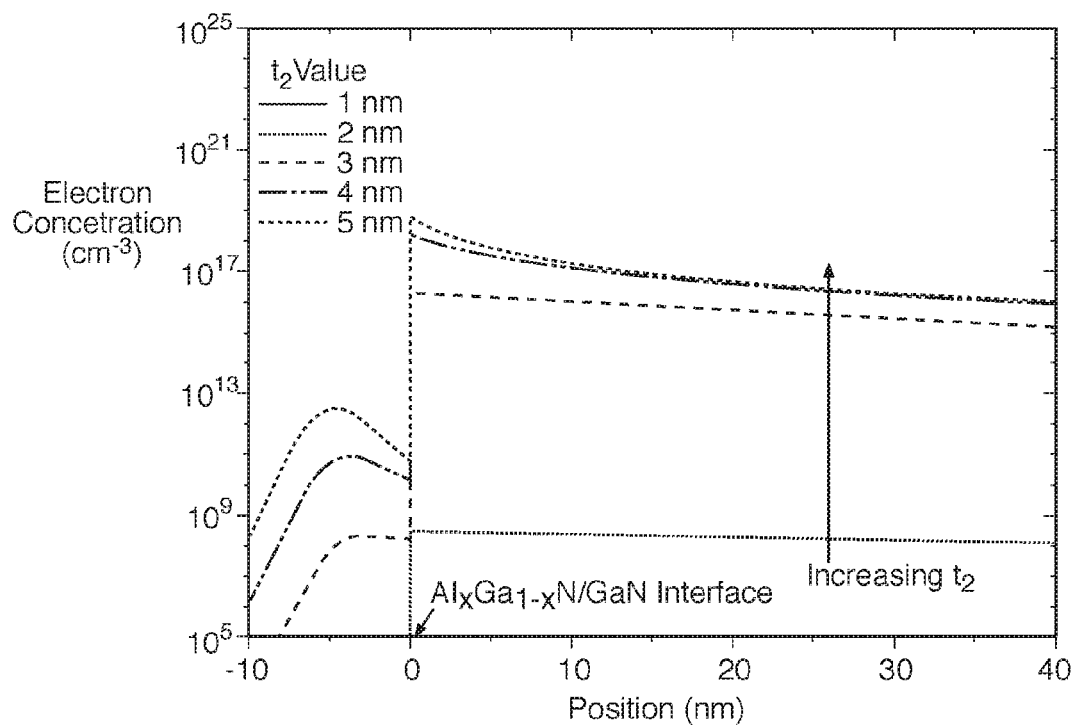
FIG. 3B is a graph illustrating simulation results of electron concentration of the n-channel, c-GaN FET as a function of increasing second thickness ($t_2$) of the second AlGaN sublayer, according to one embodiment.

With additional reference to Table 4, FIG. 3A is a graph illustrating simulation results of conduction band energy of the n-channel, c-GaN FET as a function of increasing second thickness ($t_2$) of the second AlGaN sublayer, according to one embodiment. FIG. 3B is a graph illustrating simulation results of electron concentration of the n-channel, c-GaN FET as a function of increasing second thickness ($t_2$) of the second AlGaN sublayer, according to one embodiment. The c-GaN FET 100 shows normally on behavior for $t_2$ approaching 5 nm, as illustrated in the conduction band energy graph of FIG. 3A. The thickness $t_2$ impacts net number of dopants and the conduction band minima, giving control over normally-on versus normally-off behavior. The impact of $t_2$ is reduced when the insulating layer 108 is included, compared to non-insulated gate, although the ability to create normally-on devices is possible by increasing doping or using multiple parameter variations. Large $t_2$ and high doping levels in (AlGaN)$_2$ may maximize n$_s$ (electron sheet concentration) in 2DEG, improving device performance.

TABLE 5

| Parameter | Value |
| --- | --- |
| $\Phi_M$ | 5.65 V (Pt contact) |
| $t_{ins}$ | 5 nm |
| $t_1$ | 3 nm |
| $t_2$ | 2 nm |
| $\chi_{Al}$ | 25% |
| $N_{D,t2}$ doping in δ-doped layer | $1 \times 10^{19}$ cm$^{-3}$ |
| $N_{D,SD}$ doping in source, drain | $1 \times 10^{20}$ cm$^{-3}$ |

Figure 4A:
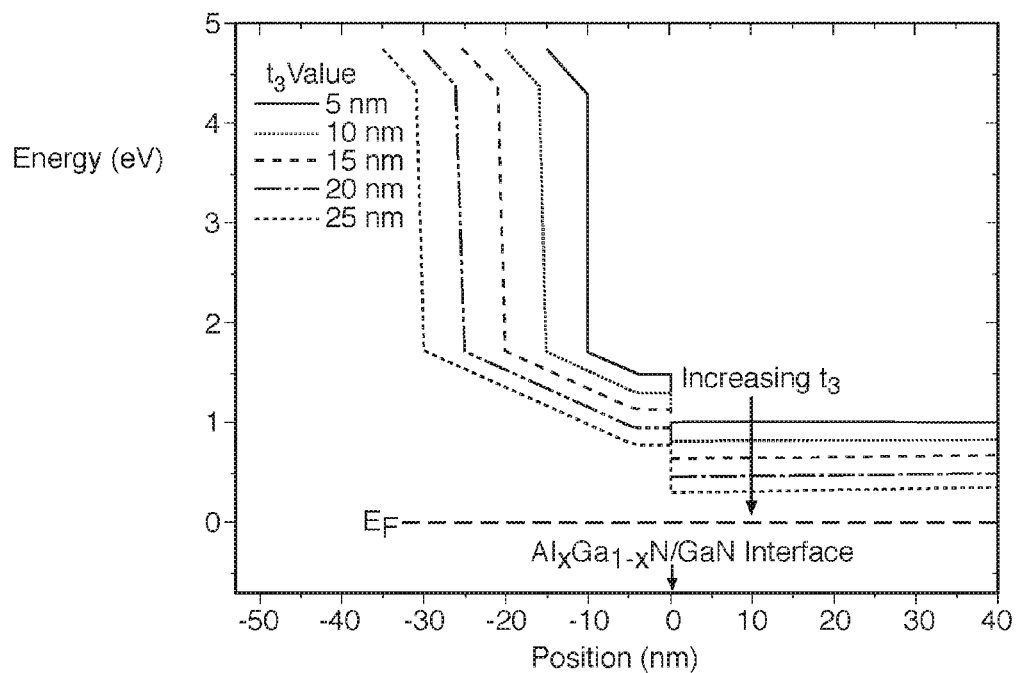
FIG. 4A is a graph illustrating simulation results of conduction band energy of the n-channel, c-GaN FET as a function of increasing third thickness ($t_3$) of the third AlGaN sublayer, according to one embodiment.
Figure 4B:
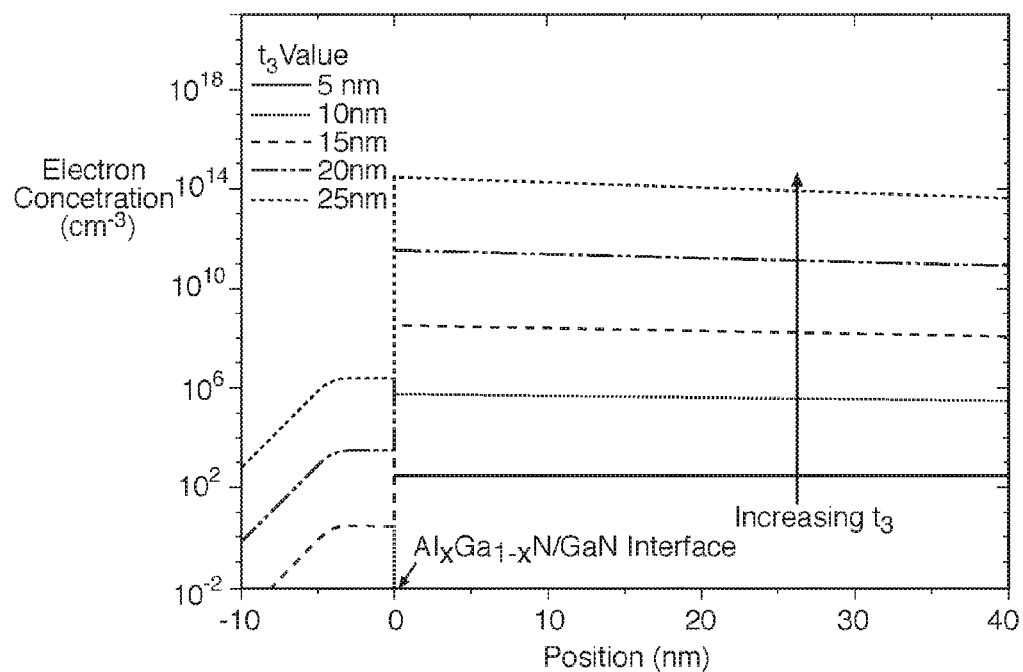
FIG. 4B is a graph illustrating simulation results of electron concentration of the n-channel, c-GaN FET as a function of increasing third thickness ($t_3$) of the third AlGaN sublayer, according to one embodiment.

With additional reference to Table 5, FIG. 4A is a graph illustrating simulation results of conduction band energy of the n-channel, c-GaN FET 100 as a function of increasing third thickness ($t_3$) of the third AlGaN sublayer, according to one embodiment. FIG. 4B is a graph illustrating simulation results of electron concentration of the n-channel, c-GaN FET 100 as a function of increasing third thickness ($t_3$) of the third AlGaN sublayer, according to one embodiment. The effect of $t_3$ is reduced compared to the non-insulated gate version of the device. The conduction band minimum decreases, but the device remains normally-off for reasonable values of $t_3$. The (AlGaN)$_3$ layer may impact gate control over the channel, so smaller $t_3$ may be designed should the increase in threshold voltage ($V_T$) be acceptable. Threshold voltage is the voltage where a transistor starts to turn on. The gate capacitance may also impact channel control. As illustrated in FIG. 4B, the equilibrium carrier concentrations remain low, confirming normally off behavior.

TABLE 6

| Parameter | Value |
| --- | --- |
| $\Phi_M$ | 5.65 V (Pt contact) |
| $t_{ins}$ | 5 nm |
| $t_1$ | 3 nm |
| $t_2$ | 2 nm |
| $t_3$ | 15 nm |

TABLE 6-continued

| Parameter | Value |
| --- | --- |
| $N_{D,t2}$ doping in δ-doped layer | $1 \times 10^{19}$ cm$^{-3}$ |
| $N_{D,SD}$ doping in source, drain | $1 \times 10^{20}$ cm$^{-3}$ |

Figure 5A:
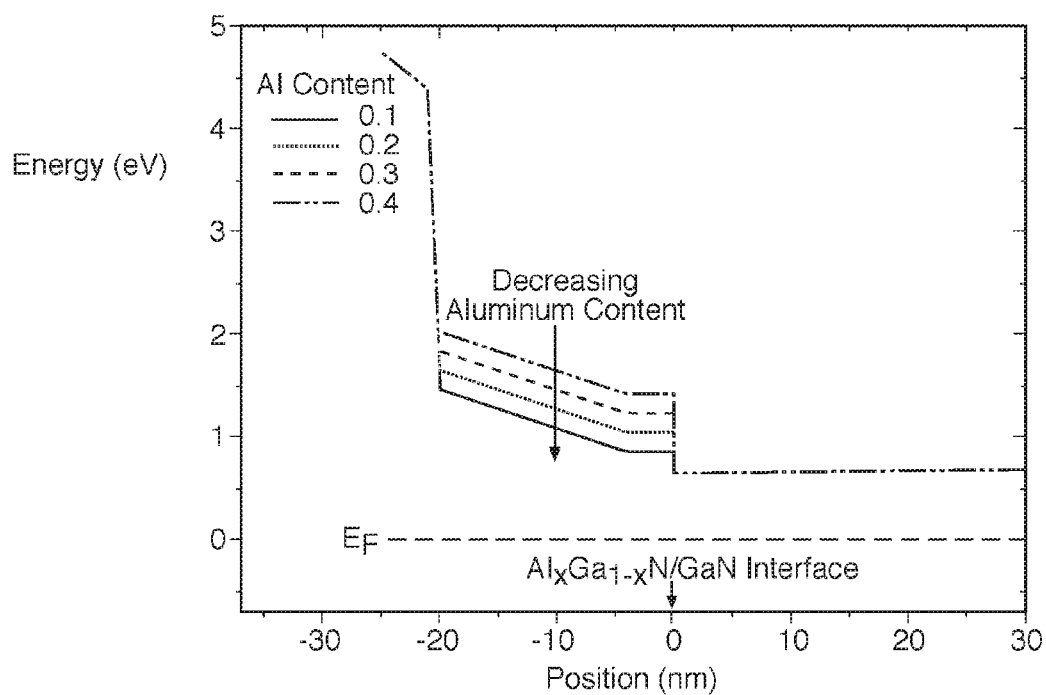
FIG. 5A is a graph illustrating simulation results of conduction band energy of the n-channel, c-GaN FET as a function of decreasing aluminum content of the AlGaN capping layer, according to one embodiment.
Figure 5B:
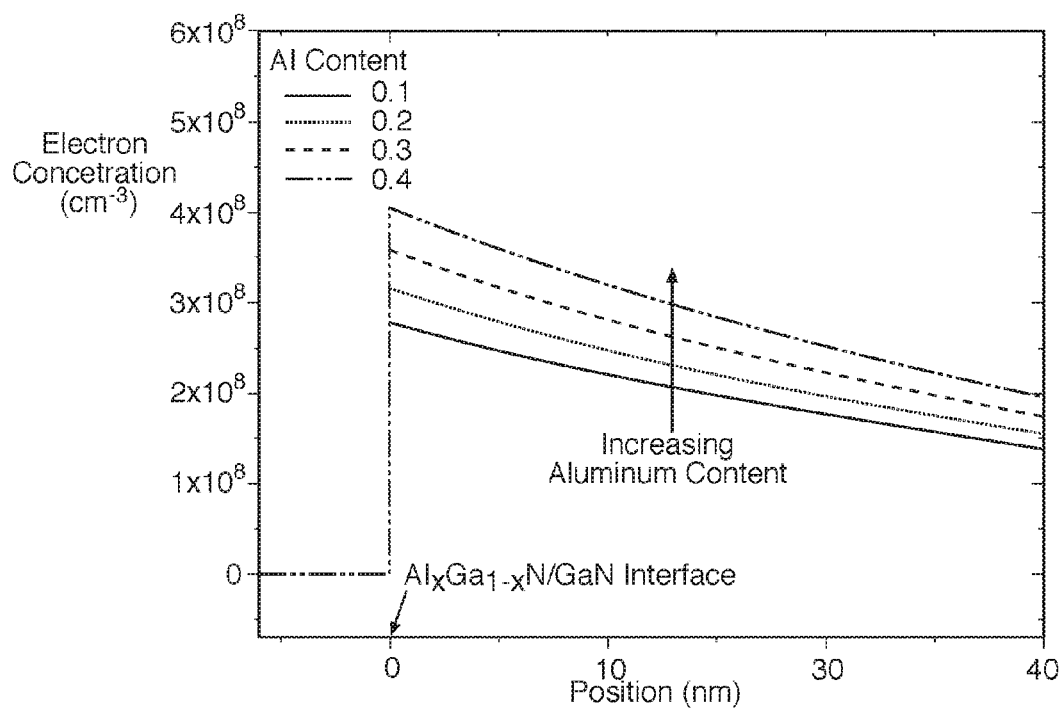
FIG. 5B is a graph illustrating simulation results of electron concentration of the n-channel, c-GaN FET as a function of increasing aluminum content of the AlGaN capping layer, according to one embodiment.

With additional reference to Table 6, FIG. 5A is a graph illustrating simulation results of conduction band energy of the n-channel, c-GaN FET as a function of decreasing aluminum content of the AlGaN capping layer 106, according to one embodiment. FIG. 5B is a graph illustrating simulation results of electron concentration of the n-channel, c-GaN FET 100 as a function of increasing aluminum content of the AlGaN capping layer 106, according to one embodiment. Aluminum content shows some impact on the normally-off versus normally-on characteristics. Changing aluminum amounts may be offset by difference in metal-semiconductor electron affinities. Significant impact on behavior can be seen if the difference in electron affinities is held constant as opposed to metal work function. Large aluminum content can lead to improved n$_s$ (electron sheet concentration) and may be designed into the AlGaN capping layer 106. Large aluminum content, however, may come at the cost of increased lattice mismatch, so that $t_3$ should also be minimized.

TABLE 7

| Parameter | Value |
| --- | --- |
| $\Phi_M$ | 5.65 V (Pt contact) |
| $t_{ins}$ | 5 nm |
| $t_1$ | 3 nm |
| $t_2$ | 2 nm |
| $t_3$ | 15 nm |
| $\chi_{Al}$ | 25% |
| $N_{D,t2}$ doping in δ-doped layer | $1 \times 10^{19}$ cm$^{-3}$ |
| $N_{D,SD}$ doping in source, drain | $1 \times 10^{20}$ cm$^{-3}$ |

Figure 6A:
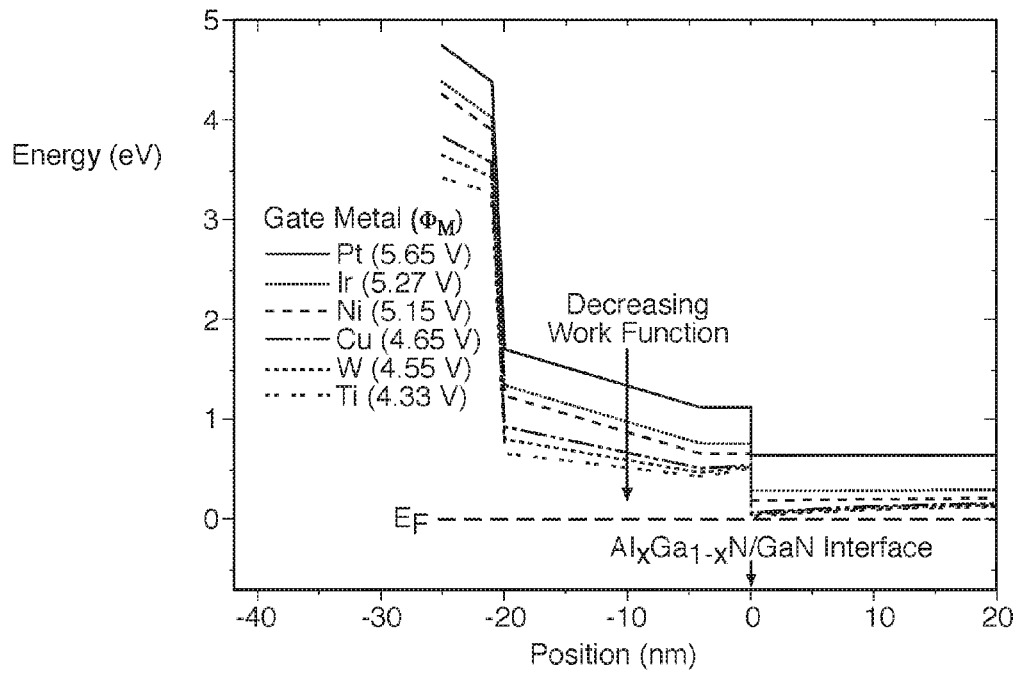
FIG. 6A is a graph illustrating simulation results of conduction band energy of the n-channel, c-GaN FET as a function of a decreasing work function of gate metal, according to one embodiment.
Figure 6B:
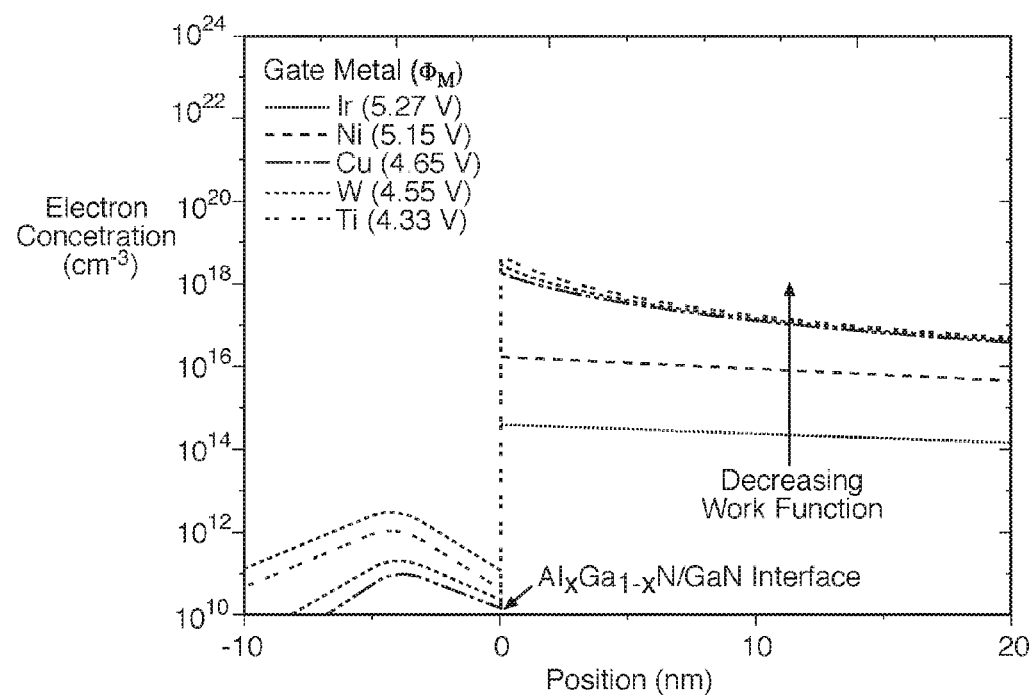
FIG. 6B is a graph illustrating simulation results of electron concentration of the n-channel, c-GaN FET as a function of decreasing work function of gate metal, according to one embodiment.

With additional reference to Table 7, FIG. 6A is a graph illustrating simulation results of conduction band energy of the n-channel, c-GaN FET 100 as a function of a decreasing work function of gate metal, according to one embodiment. FIG. 6B is a graph illustrating simulation results of electron concentration of the n-channel, c-GaN FET 100 as a function of decreasing work function of gate metal, according to one embodiment. The gate metal choice may have a large impact on the effect on normally-off versus normally-on behavior.

Gate metal, and thus gate metal work function, may be chosen to meet both performance and processing needs prior to selecting other parameters. As illustrated in FIG. 6B, as the gate metal function increases, the higher electron density of the channel. For $\Phi_M$ greater than 4.55 V, the device exhibits normally-off behavior. This corresponds to a value of $q\varphi_b = 1.3$ eV. By picking a gate metal with a sufficiently large $\Phi_M$, the device will exhibit normally-off behavior. Unlike non-insulated gate version, gate metal may not determine maximum $V_{GS}$ (electric potential difference between gate and source electrodes). In this case, the dielectric breakdown strength and $t_{ins}$ may determine maximum $V_{GS}$ instead.

Figure 7:
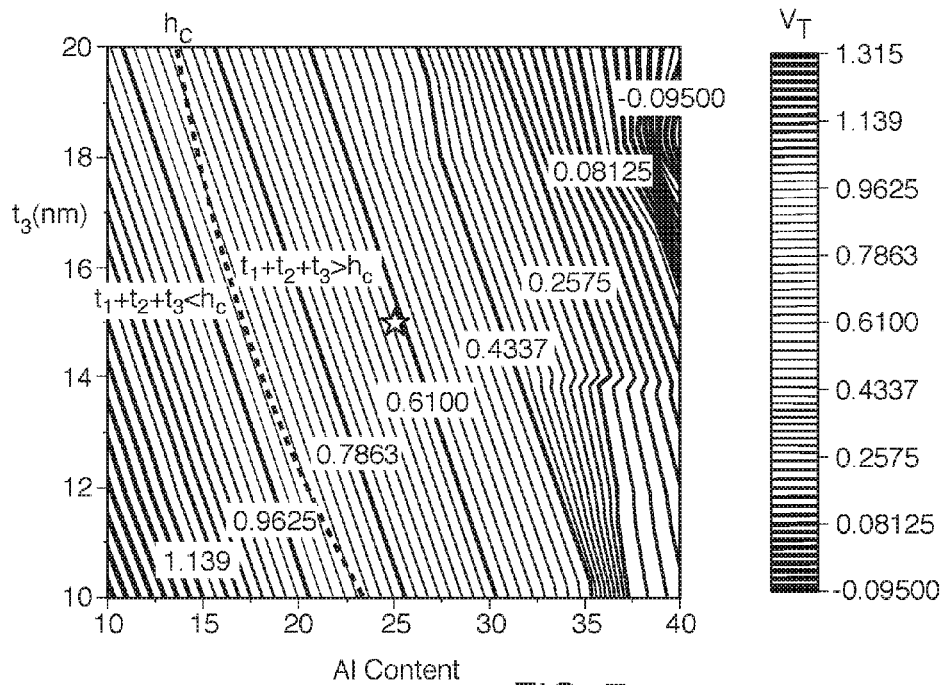
FIG. 7 is a graph illustrating turn on voltage of the disclosed c-GaN FET without the optional insulating layer as a function of aluminum content and third thickness ($t_3$), according to one embodiment.

FIG. 7 is a graph illustrating turn on voltage of the disclosed c-GaN FET 100 without the optional insulating layer 108 as a function of aluminum content and third thickness ($t_3$), according to one embodiment. In order to design a range of devices, the impact of the various design parameters may be all considered in tandem. The aluminum content is one choice for exploration due to its positive correlation to $n_S$ and inverse correlation to turn-on voltage $V_T$. To demonstrate the design space available from which to work, the c-GaN FET 100 was simulated with both aluminum content and $t_3$ variable, at which point $V_T$ was extracted from the $I_D$ versus $V_G$ curves. Plotted as a heat map, the resulting values of $V_T$ are illustrated in FIG. 7. The dashed line marks $h_c$, with a 20% margin of error considered. For the regions of the design space that feature an $Al_xGa_{1-x}N$ thickness below $h_c$, the threshold voltage is the largest offering stable normally-off design. As both $t_3$ and aluminum content increase, the value of $V_T$ is shown to become negative indicating the transition from normally-off to normally-on behavior is controlled by the device designer.

Figure 8:
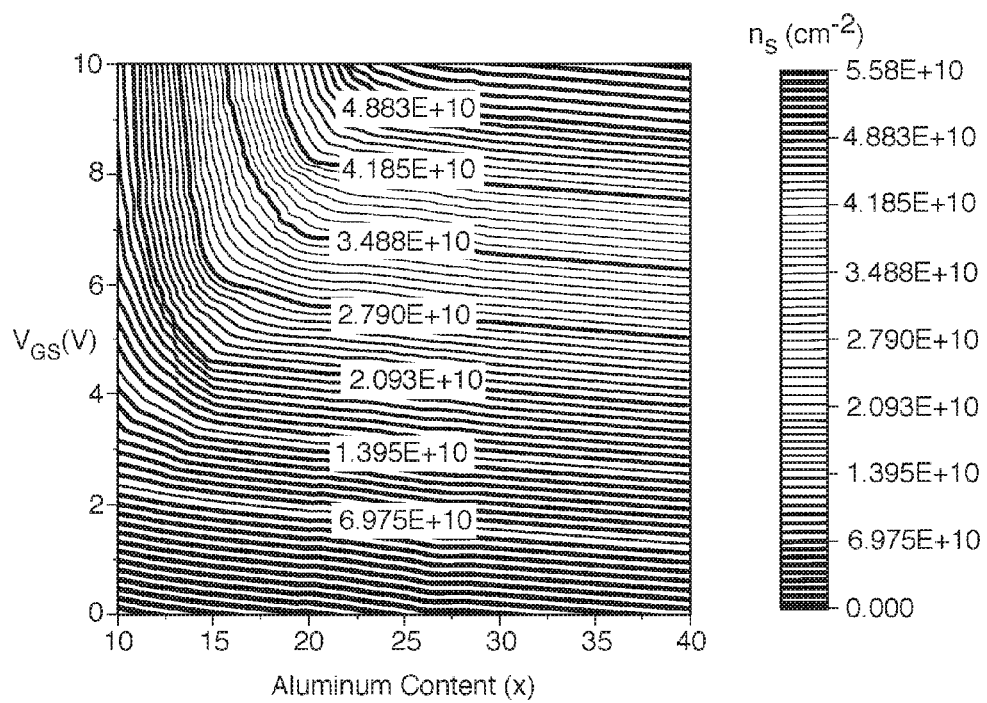
FIG. 8 is a graph illustrating 2DEG density of the disclosed c-GaN FET without the optional insulating layer as a function of aluminum content and gate bias ($V_{GS}$), according to one embodiment.

FIG. 8 is a graph illustrating 2DEG density of the disclosed c-GaN FET 100 without the optional insulating layer 108 as a function of aluminum content and gate bias ($V_{GS}$), according to one embodiment. The value of $n_s$ may be of particular relevance in FET devices for power applications. It may be directly related to the conduction band offset (FIG. 15), which is in turn influenced by the aluminum content. Based on this, the sheet density, $n_s$, may be plotted as a function of aluminum content and $V_{GS}$ as illustrated in FIG. 8. The sheet density was calculated from the volumetric electron density by integrating the volumetric carrier density across the device. The sheet density is seen to scale with both aluminum content and gate bias. By further optimizing the parameters $t_2$ and δ-doping density, higher values of $n_s$ should be attainable.

Figure 9:
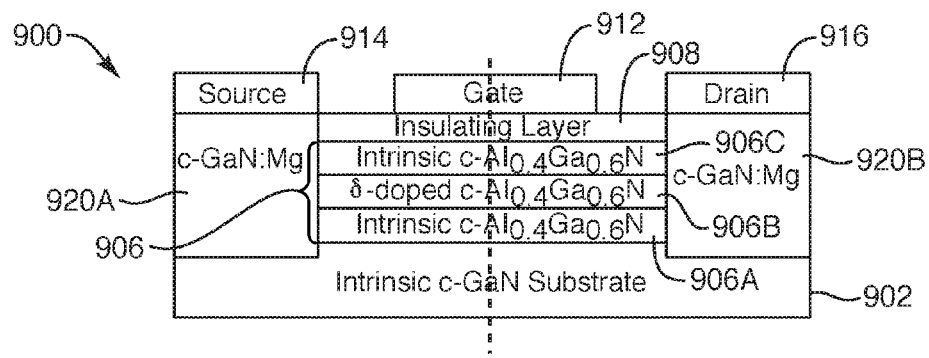
FIG. 9 is a diagram illustrating layers of a p-channel, cubic gallium nitride (c-GaN) field-effect transistor (FET), as a function of various embodiments.

FIG. 9 is a diagram illustrating layers of a p-channel, cubic gallium nitride (c-GaN) field-effect transistor (FET), referred to herein as a p-channel c-GaN FET 900, as a function of embodiments of the present disclosure. The p-channel c-GaN FET 900 may include a high resistance, c-GaN substrate 902 with a cubic AlGaN (c-AlGaN) capping layer 906, a first p-doped GaN contact region 920A, and a second p-doped GaN contact region 920B disposed on the c-GaN substrate 902. In one embodiment, the intrinsic c-AlGaN capping layer 906 is composed of 40% aluminum content and 60% gallium content, e.g., c-$Al_{0.4}Ga_{0.6}N$.

In various embodiments, an insulating layer 908 may be disposed on the AlGaN capping layer 906 to prevent current leakage. While the insulating material is illustrated as $SiO_2$, the insulating material of the insulating layer 908 may be AlN, $SiO_2$, SiN, $HfO_2$, $ZrO_2$, $Al_2O_3$, or a combination thereof. A source electrode 914 is disposed on a first p-doped GaN (c-GaN) contact region 920A, a drain electrode 916 is disposed on the second c-GaN contact region 920B, and a gate electrode 912 is disposed on the insulating layer 908. The c-GaN contact regions 920A and 920B, which may form ohmic contacts, may be doped with magnesium, or some other p-type impurity. The gate electrode 912 contact may form a metal-insulator-semiconductor system with the insulating layer 908 and the c-GaN substrate 902.

The AlGaN capping layer 906 may further include three sublayers: a first sublayer 906A of undoped, intrinsic c-phase $Al_{0.4}Ga_{0.6}N$ disposed on the intrinsic c-phase GaN substrate 902, a second sublayer 906B of doped c-phase $Al_{0.4}Ga_{0.6}N$ disposed on the first sublayer 906A, and a third sublayer 906C of undoped, intrinsic c-phase $Al_{0.4}Ga_{0.6}N$ disposed on the second sublayer 906B. The dopant used to dope the second sublayer 906B may be a p-type impurity within a delta-doped layer, the dopant including one of magnesium, carbon, or a combination thereof. The first sublayer 906A may have a first thickness ($t_1$), the second sublayer 906B a second thickness ($t_2$), and the third sublayer 906C may have a third thickness ($t_3$).

Design parameters $t_1$, $t_2$, $t_3$, doping concentration of the δ-doping, or second sublayer 906B, aluminum content, and gate metal work function were varied (thickness of the insulating layer $t_{ins}$ may be kept as a constant value of 5 nm). A number of TCAD simulations discussed herein show the c-GaN FET 900 behavior as these parameters change. Focus was put towards normally-off versus normally-on transitions. Plots of band diagrams, electron density, and current versus voltage curves are presented. The energy band diagrams are shown along the center of the c-GaN FET 900. Each simulation may vary from the following default parameters:

TABLE 8

| Parameter | Value |
|---|---|
| $t_1$ | 3 nm |
| $t_2$ | 2 nm |
| $t_3$ | 15 nm |
| $t_{ins}$ | 5 nm |
| δ-doping | $2 \times 10^{19}$ cm$^{-3}$ |
| $\chi_{Al}$ | 0.4 |
| $\Phi_M$ | 4.5 V |

Additional tables will be presented to indicate variation from these default parameters.

TABLE 9

| Parameter | Value |
|---|---|
| $t_1$ | 1 → 5 nm |
| $t_2$ | 2 nm |
| $t_3$ | 18 − $t_1$ nm |
| $t_{ins}$ | 5 nm |
| δ-doping | $2 \times 10^{19}$ cm$^{-3}$ |
| $\chi_{Al}$ | 0.4 |
| $\Phi_M$ | 4.5 V |

Figure 10:
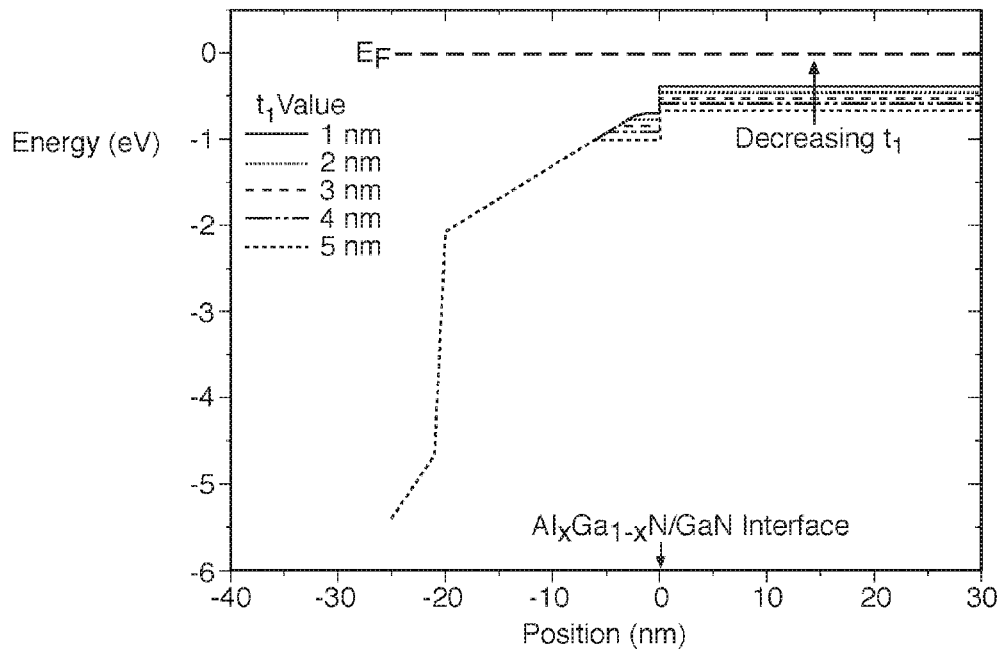
FIG. 10 is a graph illustrating simulation results of valence band energy of the p-channel, c-GaN FET as a function of a decreasing first thickness ($t_1$) of the first AlGaN sublayer, according to one embodiment.

With additional reference to Table 9, FIG. 10 is a graph illustrating simulation results of valence band energy of the p-channel, c-GaN FET 900 as a function of a decreasing first thickness ($t_1$) of the first sublayer 906A, according to one embodiment. The graph of FIG. 10 illustrates the effects of varying the separation between the δ-doped layer and the two-dimensional hole channel by varying the thickness $t_1$. Changing the thickness, $t_1$, has little impact on channel formation. For real devices, the thickness of this layer will affect the hole mobility by Coulomb scattering from the impurities of the δ-doped layer. Hence, thickness $t_1$ determines the separation between carriers and the ionized impurities.

TABLE 10

| Parameter | Value |
|---|---|
| $t_1$ | 3 nm |
| $t_2$ | 1 → 5 nm |
| $t_3$ | 17 − $t_2$ nm |
| $t_{ins}$ | 5 nm |
| δ-doping | $2 \times 10^{19}$ cm$^{-3}$ |
| $\chi_{Al}$ | 0.4 |
| $\Phi_M$ | 4.5 V |

Figure 11:
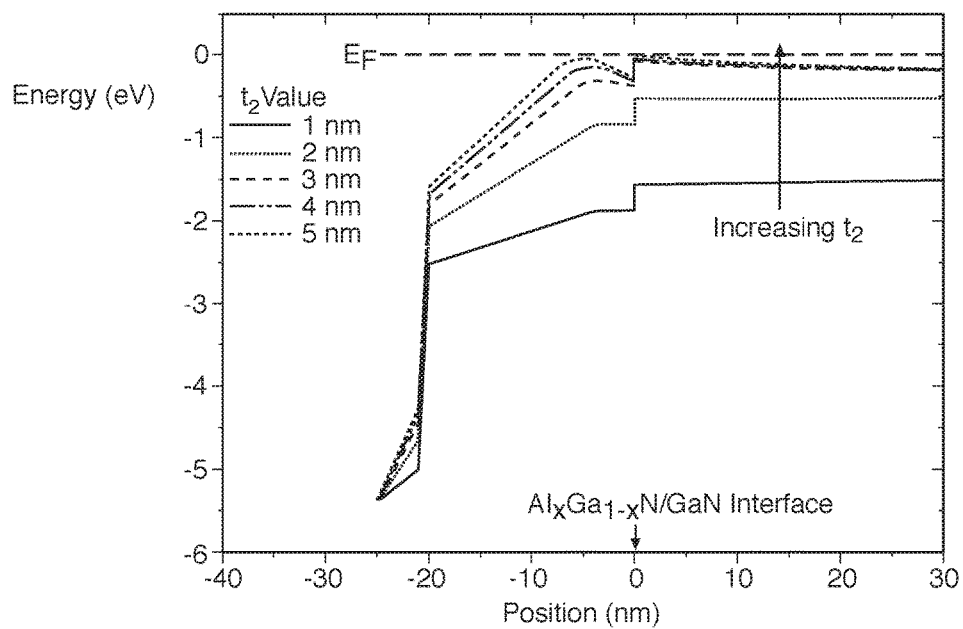
FIG. 11 is a graph illustrating simulation results of valence band energy of the p-channel, c-GaN FET as a function of an increasing second thickness ($t_2$) of the second AlGaN sublayer, according to one embodiment.

With additional reference to Table 10, FIG. 11 is a graph illustrating simulation results of valence band energy of the p-channel, c-GaN FET 900 as a function of an increasing second thickness ($t_2$) of the second sublayer 906B, according to one embodiment. The graph of FIG. 11 illustrates the effects of variation of the thickness of the δ-doped, or second sublayer 906B, $t_2$. Increasing the thickness, $t_2$, increases the overall carrier concentration of the hole channel. Increasing $t_2$ has similar effect of increasing the δ-doping concentration, where $t_2$ thicker than 3 nm makes the device almost normally-on.

TABLE 11

| Parameter | Value |
|---|---|
| $t_1$ | 3 nm |
| $t_2$ | 2 nm |
| $t_3$ | 13 → 16 nm |
| $t_{ins}$ | 5 nm |
| δ-doping | $2 \times 10^{19}$ cm$^{-3}$ |
| $\chi_{Al}$ | 0.4 |
| $\Phi_M$ | 4.5 V |

Figure 12:
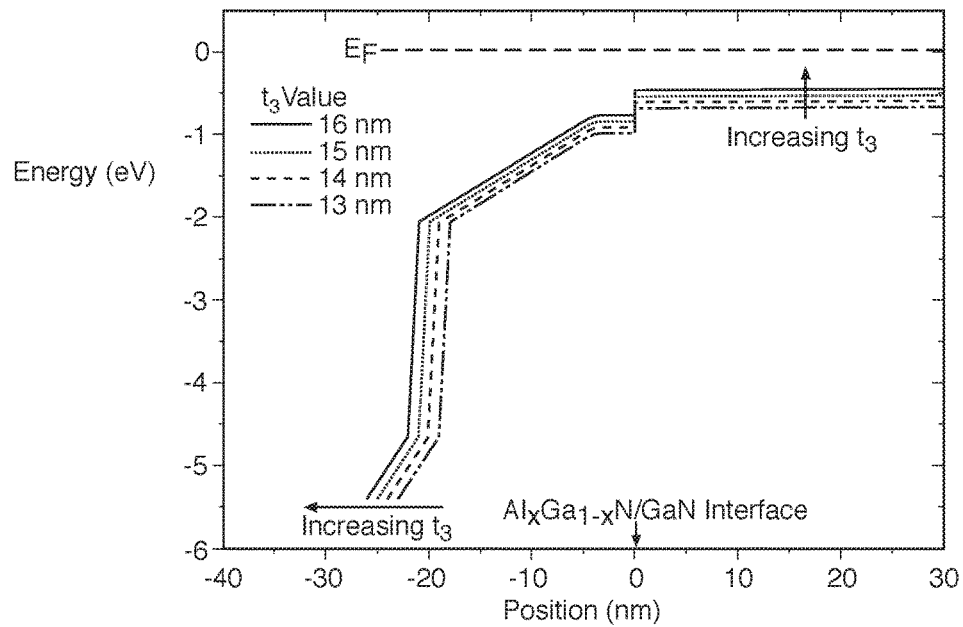
FIG. 12 is a graph illustrating simulation results of valence band energy of the p-channel, c-GaN FET as a function of an increasing third thickness ($t_3$) of the third AlGaN sublayer, according to one embodiment.

With additional reference to Table 11, FIG. 12 is a graph illustrating simulation results of valence band energy of the p-channel, c-GaN FET 900 as a function of an increasing third thickness ($t_3$) of the third sublayer 906C, according to one embodiment. The graph of FIG. 12 illustrates the effects of varying of the separation between δ-doped layer and the insulator by varying $t_3$. As illustrated, changing the thickness $t_3$ has little impact on channel formation.

TABLE 12

| Parameter | Value |
|---|---|
| $t_1$ | 3 nm |
| $t_2$ | 2 nm |
| $t_3$ | 15 nm |
| $t_{ins}$ | 5 nm |
| δ-doping | $1 \to 5 \times 10^{19}$ cm$^{-3}$ |
| $\chi_{Al}$ | 0.4 |
| $\Phi_M$ | 4.5 V |

Figure 13:
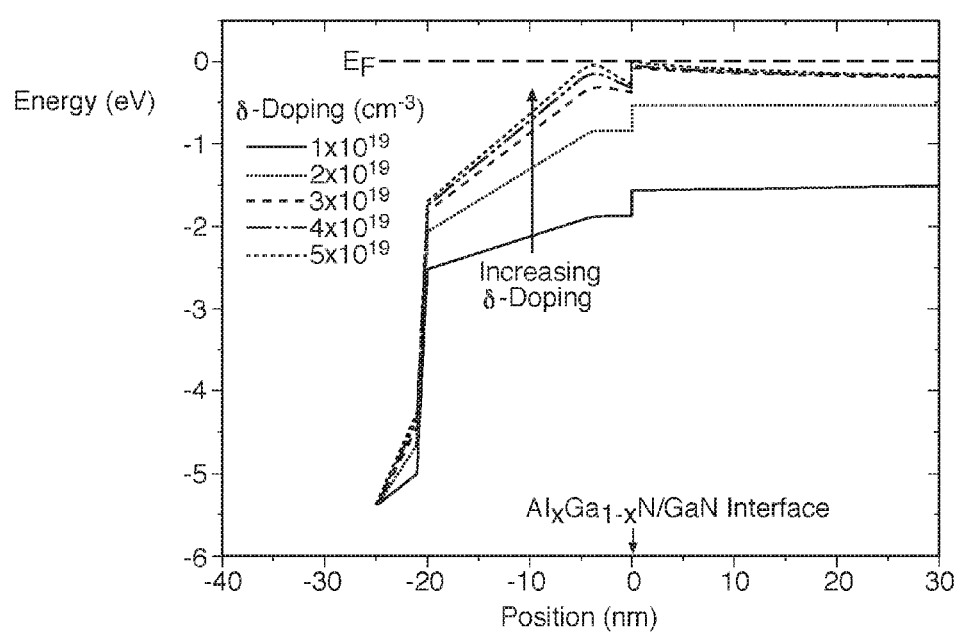
FIG. 13 is a graph illustrating simulation results of valence band energy of the p-channel, c-GaN FET as a function of increasing δ-doping of the second AlGaN sublayer, according to one embodiment.

With additional reference to Table 12, FIG. 13 is a graph illustrating simulation results of valence band energy of the p-channel, c-GaN FET 900 as a function of increasing δ-doping of the second sublayer 906B, according to one embodiment. The graph of FIG. 13 illustrates changes due to varying the doping concentration of the δ-doped, or second sublayer 906B. Increasing the doping concentration increases the overall carrier concentration of the hole channel. Increasing the concentration pulls up the valence band edge closer to the Fermi energy ($E_F$) making it easier to turn on when gate bias is applied. With doping concentration higher than $3 \times 10^{19}$ cm$^{-3}$, the device is almost ON.

Figure 14A:
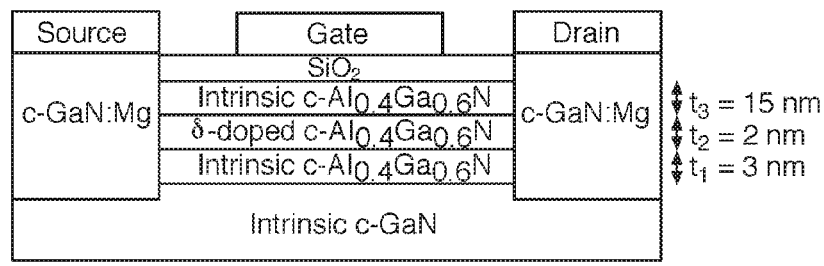
FIG. 14A is the diagram of FIG. 9, but illustrating particular values for the first thickness ($t_1$), second thickness ($t_2$), and third thickness ($t_3$), according to one embodiment.

FIG. 14A is the diagram of FIG. 9, but illustrating particular values for the first thickness ($t_1$), second thickness ($t_2$), and third thickness ($t_3$), according to one embodiment.

TABLE 13

| Parameter | Value |
|---|---|
| $t_1$ | 3 nm |
| $t_2$ | 2 nm |
| $t_3$ | 15 nm |
| $t_{ins}$ | 5 nm |
| δ-doping | $2 \times 10^{19}$ cm$^{-3}$ |
| $\chi_{Al}$ | 0.25 → 0.5 |
| $\Phi_M$ | 4.5 V |

Figure 14B:
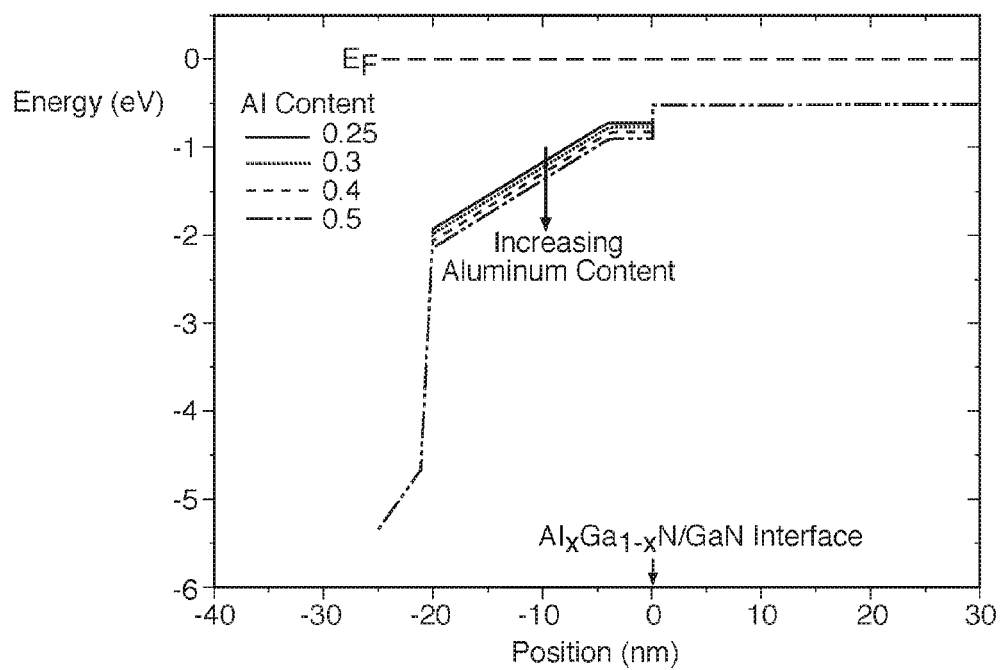
FIG. 14B is a graph illustrating simulation results of valence band energy of the p-channel, c-GaN FET as a function of increasing aluminum content of the AlGaN capping layer, according to one embodiment.

With additional reference to Table 13, FIG. 14B is a graph illustrating simulation results of valence band energy of the p-channel, c-GaN FET 900 as a function of increasing aluminum content of the AlGaN capping layer 906, according to one embodiment. In various embodiments, increasing the aluminum content increases the AlGaN capping layer 906 energy bandgap. However, most of the increase occurs on the conduction band offset. Increase in valence band offset between the AlGaN and GaN layers increases confinement of holes in the channel.

Figure 15:
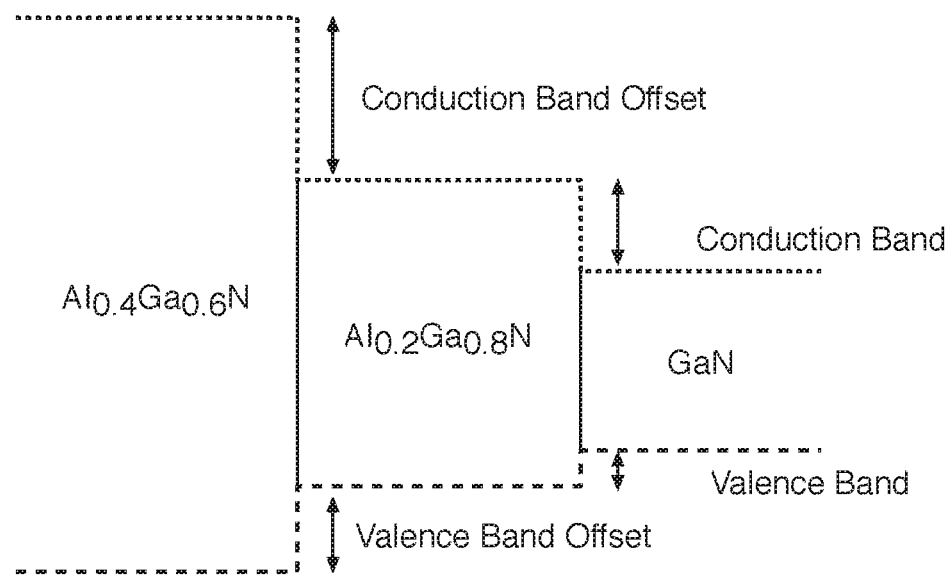
FIG. 15 is a graph illustrating both conduction band offset and valence band offset of, respectively, the conduction and valence bands of the AlGaN capping layer, according to various embodiments.

FIG. 15 is a graph illustrating both conduction band offset and valence band offset of, respectively, the conduction and valence bands of the AlGaN capping layer 906, according to various embodiments. Energy band gap is a material property that tells the energy difference between the conduction band and the valence band. In the graph of FIG. 15, the bands may bend or tilt but the gap may be kept constant provided that the material is identical. For ternary semiconductor materials such as AlGaN, the band gap energy can change depending on the amount of aluminum content. The band gap increases with the aluminum content.

However, as can be seen from the band gaps of FIG. 15, the conduction band offset and valence band offset are not equal. For example, the conduction band offset is generally larger than the valence band offset. These offsets function as a wall for the carriers (electrons and holes) so that they don't spill out of the channel at the hetero-interface, e.g., at the portion of the band gaps between material interfaces. Conduction band offset is the wall for electrons and the valence band offset is the wall for holes.

As the p-channel device operation is based on holes, the focus is on the valence band and the valence band offset, whereas for the n-channel, the focus is on the conduction band. Electrons like to gather around the lower parts of the conduction band whereas holes like to gather around the higher parts of the valence band.

The situation for the p-channel device and holes are exactly the same, except that the valence band is upside down where the holes still gather within the channel. The reason higher aluminum content is desired for the p-channel device is because with the same aluminum content, the valence offset is smaller compared to the conduction band offset. To have a wall with a similar height for the p-channel device, one may use $Al_{0.4}Ga_{0.6}N$ instead of $Al_{0.25}Ga_{0.75}N$ or $Al_{0.2}Ga_{0.8}N$.

TABLE 13

| Parameter | Value |
|---|---|
| $t_1$ | 3 nm |
| $t_2$ | 2 nm |
| $t_3$ | 15 nm |
| $t_{ins}$ | 5 nm |
| δ-doping | $2 \times 10^{19}$ cm$^{-3}$ |
| $\chi_{Al}$ | 0.4 |
| $\Phi_M$ | 4.33 → 5.65 V |

Figure 16:
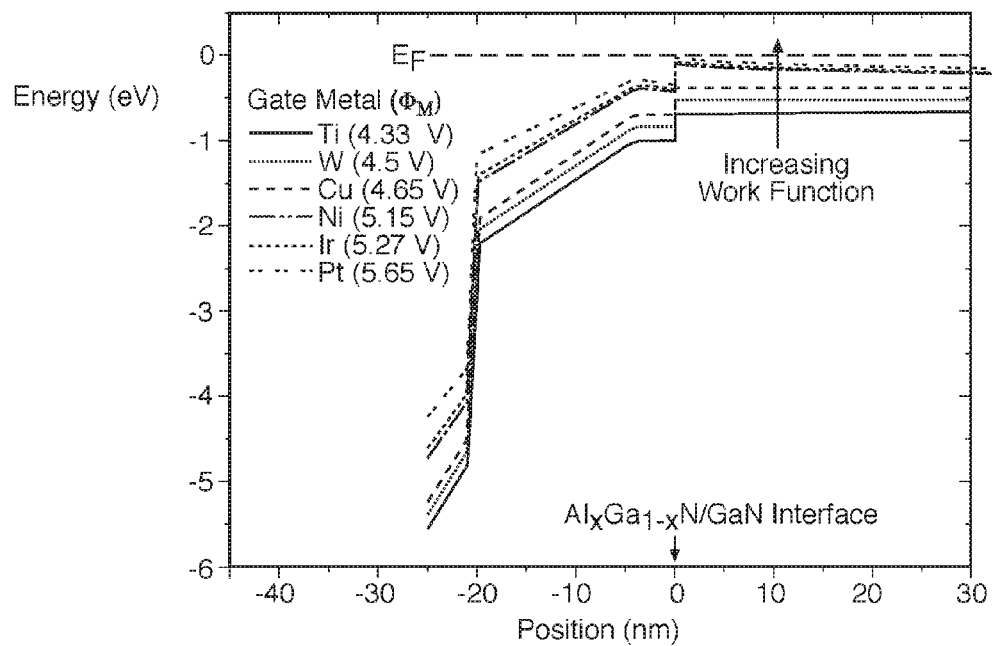
FIG. 16 is a graph illustrating simulation results of valence band energy of the p-channel, c-GaN FET as a function of increasing work function of the gate metal of the gate electrode, according to one embodiment.

With additional reference to Table 13, FIG. 16 is a graph illustrating simulation results of valence band energy of the p-channel, c-GaN FET 900 as a function of increasing work function of the gate metal of the gate electrode 912, according to one embodiment. The work function ($\Phi_M$) of the metal of the gate electrode 912 is material dependent, and the graph of FIG. 16 illustrates a varying work function of the following metals: Ti, W, Cu, Ni, Ir, and Pt. The gate metal has an effect on the entire energy band. Metals with work function larger than 5.15 V lets the device operate in depletion mode (normally-on).

Figure 17:
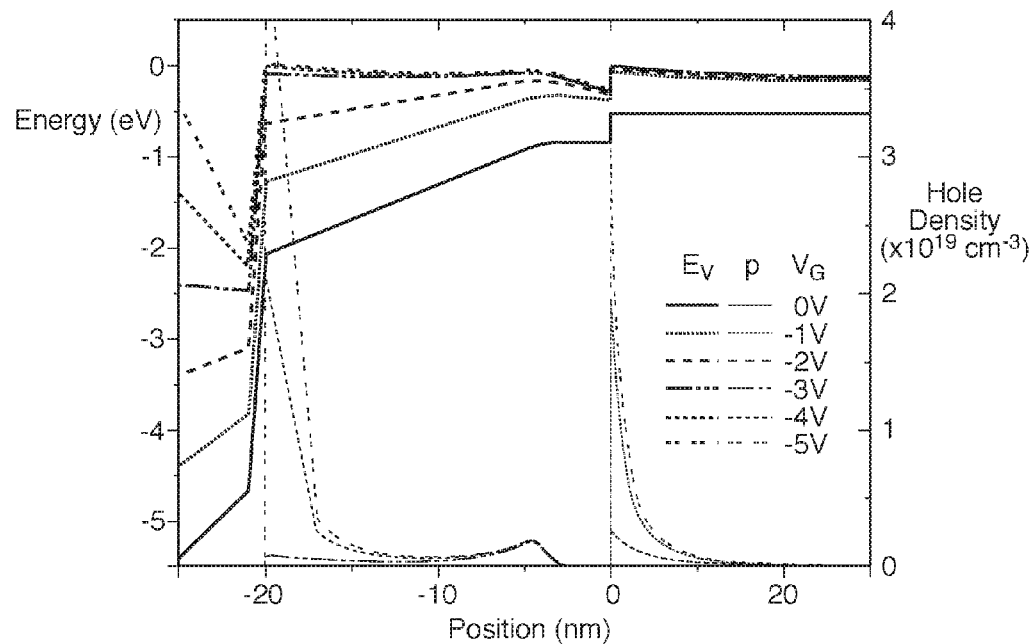
FIG. 17 is a graph illustrating simulation results of valence band energy and hole density of the p-channel, c-GaN FET as a function of gate bias, according to one embodiment.

FIG. 17 is a graph illustrating simulation results of valence band energy and hole density of the p-channel, c-GaN FET 900 as a function of gate bias, according to one embodiment. The parameters of the p-channel, c-GaN FET 900 may be those of the default listed in Table 8. The graph illustrated valence band energy ($E_V$) and hole density ($\times 10^{19}$ cm$^{-3}$) as a function of gate bias ($V_G$). A gate bias lower than $-3$ V does not increase the hole density in the hole channel anymore.

Figure 18:
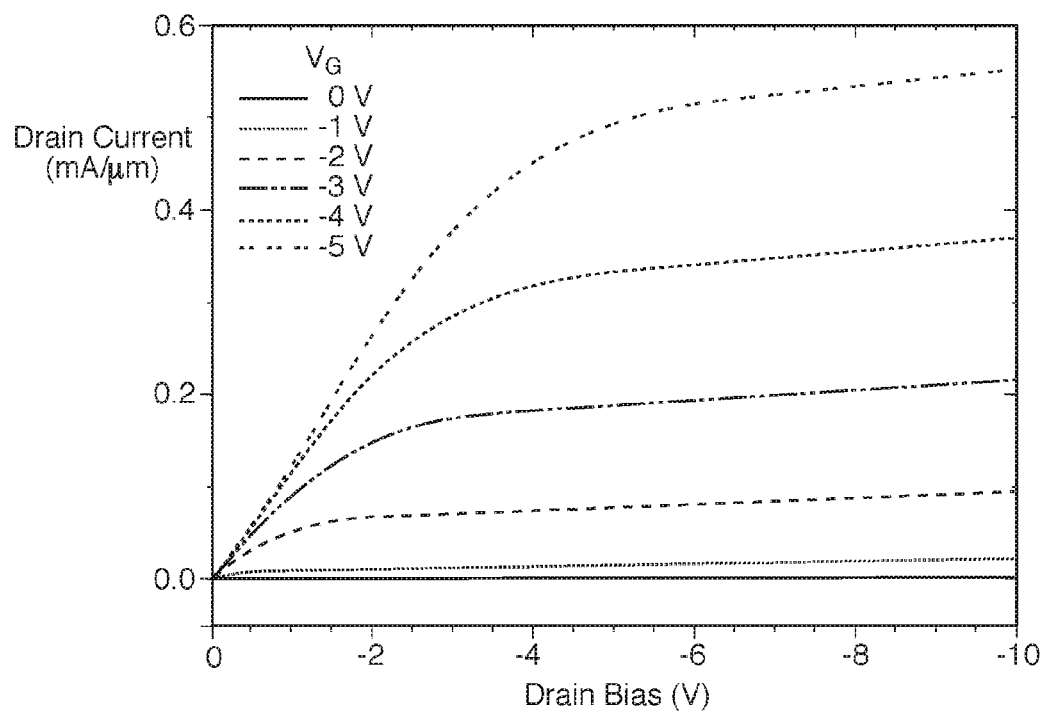
FIG. 18 is a graph illustrating simulation of drain current versus drain bias of the p-channel, c-GaN FET, according to one embodiment.

FIG. 18 is a graph illustrating simulation of drain current versus drain bias of the p-channel, c-GaN FET 900, according to one embodiment. The graph illustrates an $I_D$-$V_D$ curve with the default design parameters, showing normally-off behavior. When $V_G$=0 V, regardless of the drain bias, the drain current ($I_D$) is zero.

Figure 19:
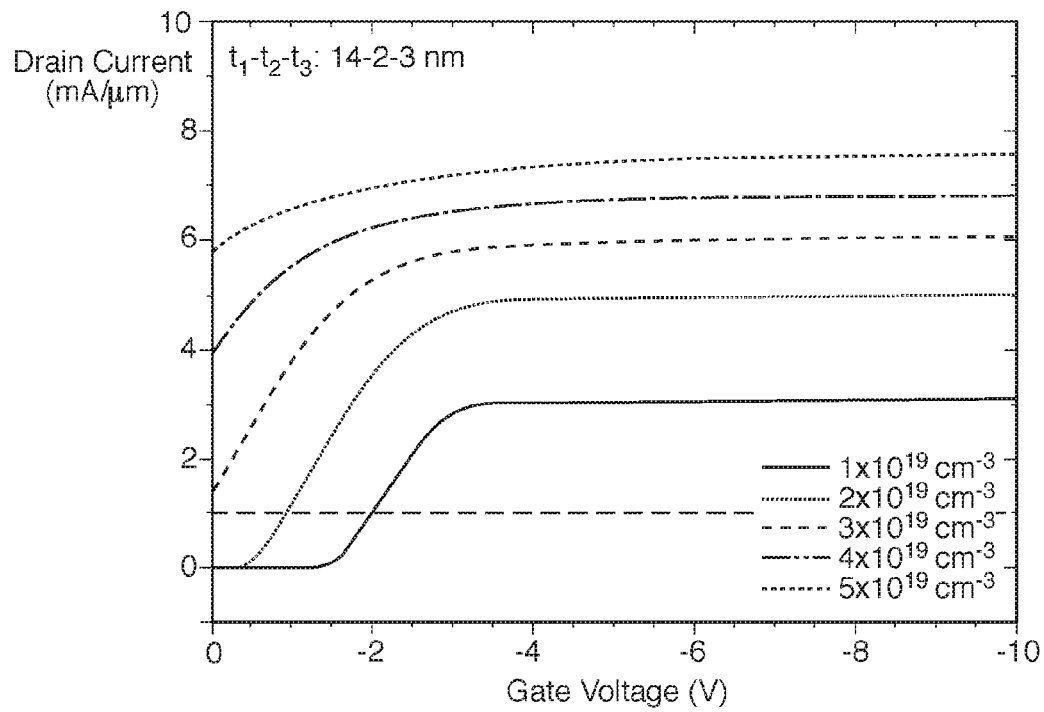
FIG. 19 is a graph illustrating simulation results of drain current versus gate bias of the p-channel, c-GaN FET, according to one embodiment.

With additional reference to Table 12, FIG. 19 is a graph illustrating simulation results of drain current versus gate bias of the p-channel, c-GaN FET 900, according to one embodiment. The graph of FIG. 19 illustrates a $I_D$-$V_G$ ($V_D$=50 mV) curve with $t_3$=14 nm and different δ-doping concentrations (per Table 12). As illustrated, the p-channel, c-GaN FET 900 illustrates normally-off behavior when doping concentration is less than or equal to $2\times 10^{19}$ cm$^{-3}$. The threshold voltage can be controlled effectively by changing δ-doping concentrations.

Figure 20:
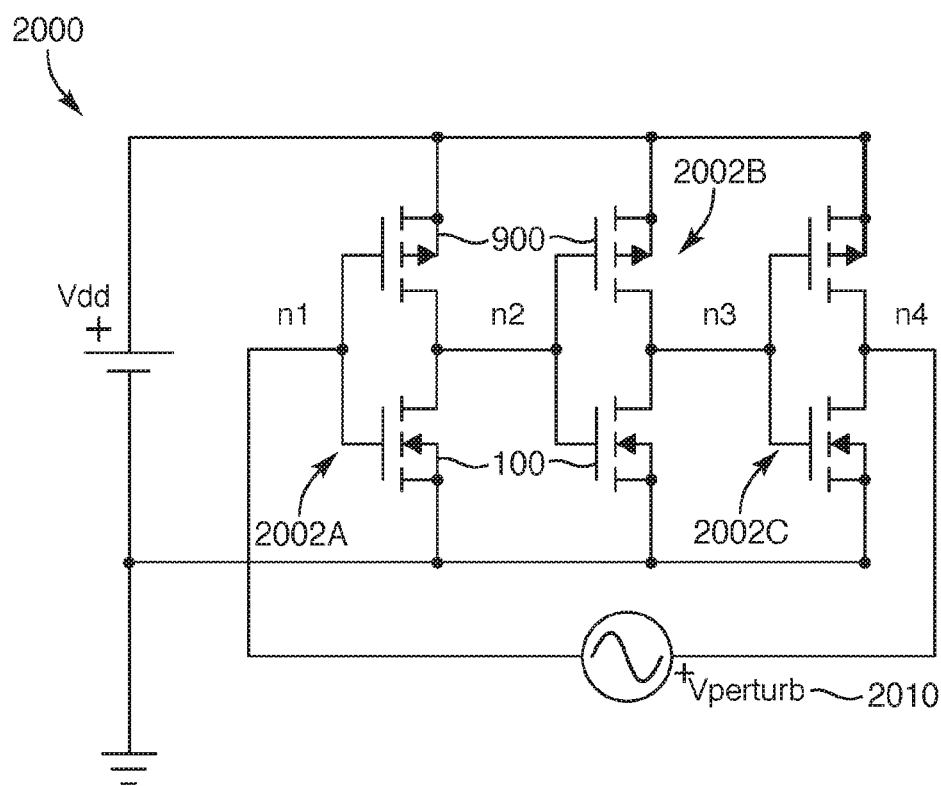
FIG. 20 is an electrical schematic diagram of a ring oscillator using the disclosed c-GaN FETs within a series of inverters, according to one embodiment.

FIG. 20 is an electrical schematic diagram of a ring oscillator 2000 using the disclosed c-GaN FETs 100 and 900 within a series of inverters 2002A, 2002B, and 2002C, according to one embodiment. The ring oscillator 2000 may include three stages, each of which may be an inverter having a p-channel, c-GaN FET 900 coupled to an n-channel, c-GaN FET 100, which forms four nodes (n1, n2, n3, n4). The ring oscillator 2000 was simulated using Sentaurus to find out the transient behavior of the cubic-GaN inverter under load.

In one embodiment, the width-to-length (W/L) ratio for all NMOS devices in the ring oscillator 2000 may be set to 10 with $L_G$ (gate length) being approximately 250 nm, where $V_{DD}$ is set to 2.5 V. Other values are envisioned, and these are provided for purposes of correlation with the simulations of FIGS. 21A and 21B. The circuit solution is found under equilibrium. To begin oscillations, the $V_{DD}$ is ramped from 0 V to 2.5 V under transient simulation. Transient biasing is required here due to inherent instability of the oscillator. A perturbing source 2010, which may connect nodes n1 and n4, may be set to short circuit while $V_{DD}$ ramps. A perturbation is then applied as a pulse to start oscillations, and then returned to behaving as a short circuit. The ring oscillator 2000 may asymptotically approach n1=n2=n3=n4≈$V_{DD}$/2 in simulations without this perturbing voltage.

Figure 21A:
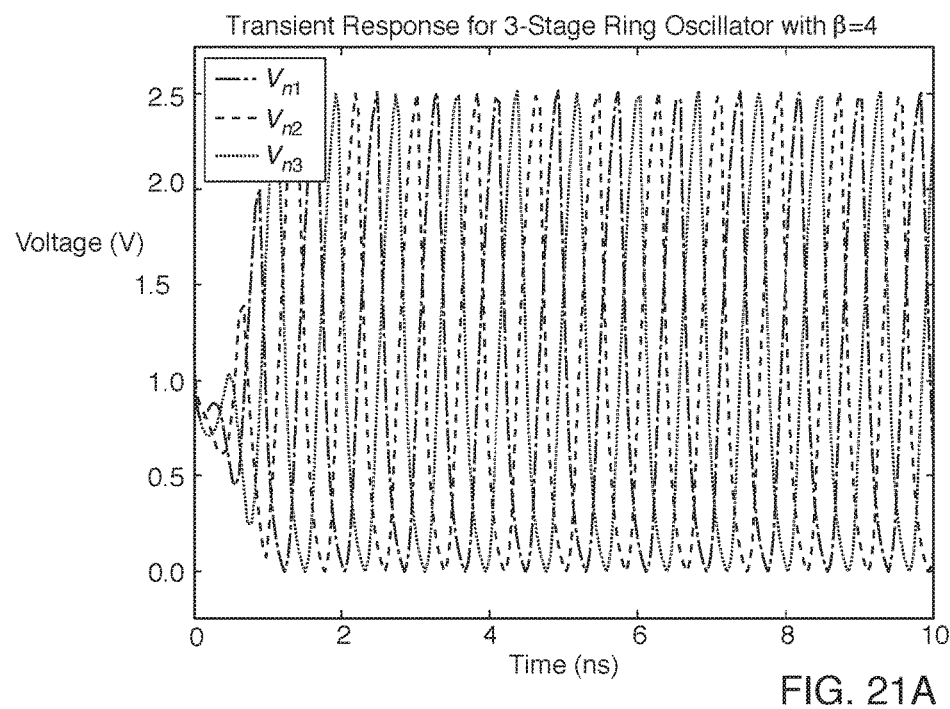
FIGS. 21A and 21B are graphs illustrating simulation of the ring oscillator of FIG. 20, where the PMOS to NMOS length ratio (β) is set to 4, indicating voltage oscillations between −0.0175V and 2.51V, according to various embodiments.
Figure 21B:
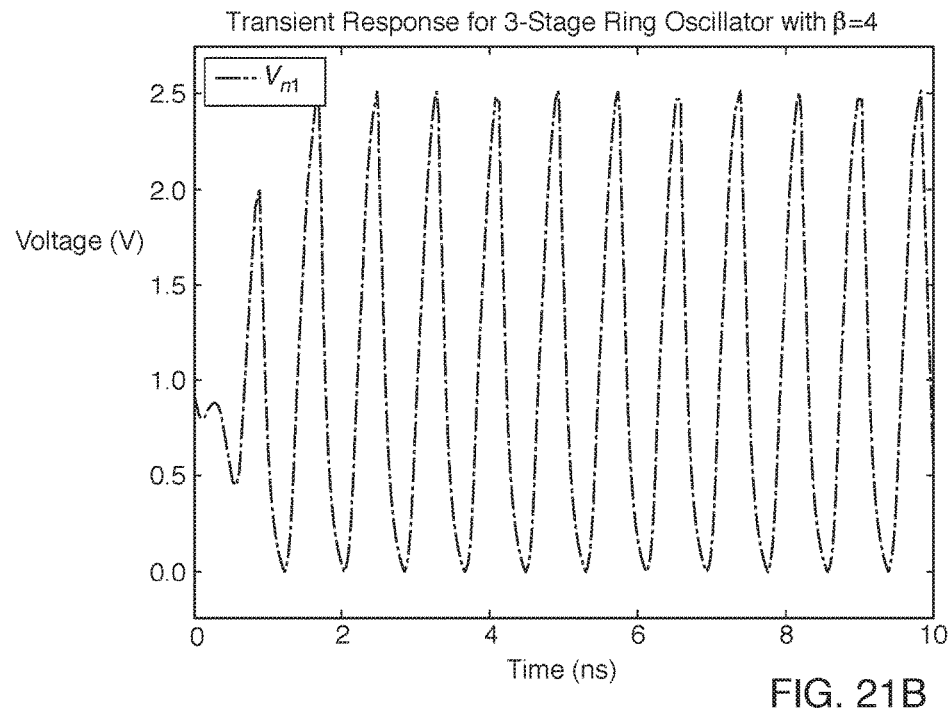

FIGS. 21A and 21B are graphs illustrating simulation of the ring oscillator 2000 of FIG. 20, indicating voltage oscillations between −0.0175V and 2.51V, according to one embodiment. The transient response from β=4 (optimum sizing found for a single device with an ideal input and no load) is illustrated in FIG. 21A, where β refers to the PMOS to NMOS length ratio. The graph in FIG. 21B is the transient response for a single node. A node oscillates at approximately 1.22 GHz, and between −0.0175 V and 2.51 V, indicating ability to reach 0 and $V_{DD}$, as desired.

Figure 22:
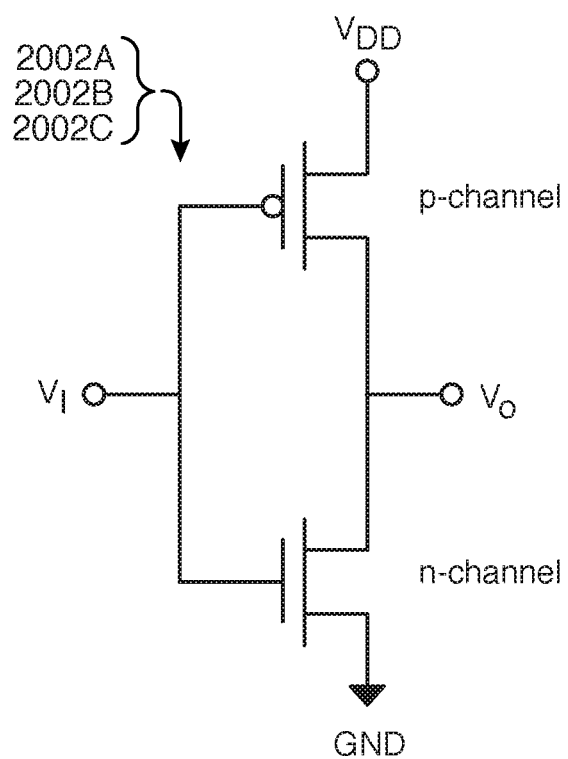
FIG. 22 is an electrical schematic diagram of one of the inverters of FIG. 20, illustrating use of both p-channel and n-channel c-GaN FET devices, according to one embodiment.

FIG. 22 is an electrical schematic diagram of one of the inverters 2002A, 2002B, or 2002C of the ring oscillator 2000 of FIG. 20, illustrating use of both p-channel and n-channel c-GaN FET devices, according to one embodiment. An inverter is a basic component of a logic circuit and includes one n-channel device and one p-channel device. When a high signal is input to the inverter, the output of the inverter becomes a low signal and when a low signal is input, a high signal is output. Circuit designers want these inverters to give output as fast as possible: the time to get a flipped output signal, when the input signal is flipped, defines the delay time of the inverter. For the inverters to work symmetrically—meaning that the transition time of the output to change from high to low is equal to the transition time to change the output from low to high—a designer wants the p-channel and n-channel devices to have the same amount of current flowing. The amount of current of each of these p-channel and n-channel devices can be controlled by changing the width-to-length ratio (W/L). More current is able to flow when W/L is larger. To match the current between the p- and n-channel device, a designer may control the ratio between the W/L ratios (β), as follows:

$$\beta = \frac{(W/L)_{p-channel}}{(W/L)_{n-channel}}.$$

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. A normally-off, heterojunction field effect transistor, comprising:
   an intrinsic cubic-phase gallium nitride (c-GaN) substrate;
   an aluminum gallium nitride (AlGaN) capping layer disposed on the c-GaN substrate, wherein the AlGaN capping layer comprises:
      a first sublayer of intrinsic c-phase $Al_xGa_{1-x}N$ disposed on the c-GaN substrate, wherein the first sublayer is of a first thickness; and
      a second sublayer of doped c-phase $Al_xGa_{1-x}N$ disposed on the first sublayer, wherein the second sublayer is of a second thickness and is doped with a dopant;
   an insulating layer disposed on an entirety of the AlGaN capping layer, wherein the insulating layer is of a fourth thickness;
   a source electrode positioned adjacent a first side of the insulating layer;
   a drain electrode positioned adjacent a second side of the insulating layer opposite from the first side; and
   a gate electrode disposed on the insulating layer and positioned between the source electrode and the drain electrode, wherein the source electrode, the drain electrode, and the gate electrode are connectable to function as a logic device.

2. The transistor of claim 1, wherein the dopant is a p-type impurity within a delta-doped layer, the dopant comprising one of magnesium, carbon, or a combination thereof.

3. The transistor of claim 1, wherein the dopant is an n-type impurity within a delta-doped layer, the dopant comprising one of silicon, germanium, or a combination thereof.

4. The transistor of claim 1, wherein the insulating layer is of a material comprising one of AlN, $SiO_2$, SiN, $HfO_2$, $ZrO_2$, $Al_2O$, or a combination thereof.

5. The transistor of claim 1, wherein the first thickness is between approximately 2 nm and 10 nm.

6. The transistor of claim 1, wherein the second thickness is between approximately 1 nm and 5 nm.

7. The transistor of claim 1, wherein the AlGaN capping layer further comprises a third sublayer of intrinsic c-phase $Al_xGa_{1-x}N$ disposed on the second sublayer, wherein the third sublayer is of a third thickness.

8. The transistor of claim 7, wherein the third thickness is between approximately 10 nm and 25 nm.

9. The transistor of claim 1, wherein the fourth thickness is between approximately 1 nm and 10 nm.

10. The transistor of claim 1, wherein aluminum content, x, of the AlGaN capping layer is between approximately 10% and 50% of total content.

11. The transistor of claim 1, wherein the dopant is a p-type impurity, and the aluminum content, x, of the AlGaN capping layer is between approximately 38% and 42% of total content.

12. The transistor of claim 1, wherein the dopant is an n-type impurity, and wherein the aluminum content, x, of the AlGaN capping layer is between approximately 23% and 27% of total content.

13. The transistor of claim 1, wherein the gate electrode is made of a metal selected from one of Pt, Ni, Cu, W, Ti, TiN, or a combination thereof, which comprises a work function greater than 4V.

14. The transistor of claim 1, further comprising:
a first GaN contact region disposed between the c-phase GaN substrate and the source electrode to create a first ohmic contact between the source electrode and the first GaN contact region; and
a second GaN contact region disposed between the c-phase GaN substrate and the drain electrode to create a second ohmic contact between the drain electrode and the second GaN contact region, and wherein the AlGaN capping layer is disposed between the first GaN contact region and the second GaN contact region.

15. The transistor of claim 1, wherein the dopant is a p-type impurity, and wherein the source electrode and the drain electrode are made of a metal comprising one of Ni, Pt, Au, Pb, or a combination thereof.

16. The transistor of claim 1, wherein the dopant is an n-type impurity, and wherein the source electrode and the drain electrode are of a metal comprising one of Ti, Al, Pd, Ag, Nd, or a combination thereof.

17. A complementary logic circuit comprising a first of the transistor of claim 1, wherein the second sublayer is n-doped and a second of the transistor of claim 1, wherein the second sublayer is p-doped.

18. A normally-off, heterojunction field effect transistor, comprising:
an intrinsic cubic-phase gallium nitride (c-GaN) substrate;
an aluminum gallium nitride (AlGaN) capping layer disposed on the c-GaN substrate, wherein the AlGaN capping layer comprises:
a first sublayer of intrinsic c-phase $Al_xGa_{1-x}N$ disposed on the c-GaN substrate, wherein the first sublayer is of a first thickness;
a second sublayer of doped c-phase $Al_xGa_{1-x}N$ disposed on the first sublayer, wherein the second sublayer is of a second thickness and is doped with a dopant; and
a third sublayer of intrinsic c-phase $Al_xGa_{1-x}N$ disposed on the second sublayer, wherein the third sublayer is of a third thickness;
an insulating layer disposed on an entirety of the third sublayer, wherein the insulating layer is of a fourth thickness;
a source electrode positioned adjacent to a first side of the insulating layer;
a drain electrode positioned adjacent to a second side of the insulating layer opposite from the first side; and
a gate electrode disposed on the insulating layer and positioned between the source electrode and the drain electrode, wherein the source electrode, the drain electrode, and the gate electrode are connectable to function as a logic device.

19. A complementary logic circuit comprising a first of the transistor of claim 18, wherein the second sublayer is n-doped and a second of the transistor of claim 18, wherein the second sublayer is p-doped.

20. The transistor of claim 18, wherein the fourth thickness is between approximately 1 nm and 10 nm.

21. The transistor of claim 18, wherein the dopant is an n-type impurity within a delta-doped layer, the dopant comprising one of silicon, germanium, or a combination thereof.

* * * * *